United States Patent
Iwata et al.

(10) Patent No.: US 8,423,850 B2
(45) Date of Patent: Apr. 16, 2013

(54) SYSTEM DEBUGGING METHOD, SYSTEM DEBUGGING EQUIPMENT, PROCESSOR, WIRELESS-COMMUNICATIONS INTERFACE IC AND INTERFACE METHOD THEREOF

(75) Inventors: Shunichi Iwata, Tokyo (JP); Yoichi Takahata, Tokyo (JP); Toshihiko Sugahara, Tokyo (JP); Yutaka Takikawa, Itami (JP); Yoshihiro Shimizu, Itami (JP); Hiroki Ishikuro, Yokohama (JP); Tadahiro Kuroda, Yokohama (JP)

(73) Assignees: Renesas Electronics Corporation, Kawasaki-shi (JP); Keio University, Tokyo (JP)

( * ) Notice: Subject to any disclaimer, the term of this patent is extended or adjusted under 35 U.S.C. 154(b) by 1012 days.

(21) Appl. No.: 12/514,023

(22) PCT Filed: Nov. 8, 2007

(86) PCT No.: PCT/JP2007/071706
§ 371 (c)(1),
(2), (4) Date: May 7, 2009

(87) PCT Pub. No.: WO2008/056739
PCT Pub. Date: May 15, 2008

(65) Prior Publication Data
US 2010/0040123 A1 Feb. 18, 2010

(30) Foreign Application Priority Data
Nov. 10, 2006 (JP) ................. 2006-305299

(51) Int. Cl.
| | | |
|---|---|---|
| G01R 31/28 | (2006.01) |
| G01R 31/08 | (2006.01) |
| G06F 11/00 | (2006.01) |
| G08C 15/00 | (2006.01) |
| H04J 1/16 | (2006.01) |
| H04J 3/14 | (2006.01) |
| H04L 1/00 | (2006.01) |
| H04L 12/26 | (2006.01) |
| H03C 1/62 | (2006.01) |
| H04B 17/00 | (2006.01) |
| H04B 10/08 | (2006.01) |
| H04W 24/00 | (2009.01) |

(52) U.S. Cl.
USPC ........ 714/742; 714/821; 370/242; 455/115.1; 455/115.2; 455/226.1; 455/423; 398/10; 398/13; 398/17; 398/22; 398/23; 398/24; 398/31

(58) Field of Classification Search .................. 714/742, 714/821; 370/242; 455/423, 115.1, 115.2, 455/226.1; 398/10, 13, 17, 22, 23, 24, 31
See application file for complete search history.

(56) References Cited

U.S. PATENT DOCUMENTS
6,301,514 B1 * 10/2001 Canada et al. ................ 700/108
6,466,130 B2 * 10/2002 Van Horn et al. .......... 340/572.1
(Continued)

FOREIGN PATENT DOCUMENTS
| JP | 2003-5994 A | 1/2003 |
| JP | 2005-18703 A | 1/2005 |
(Continued)

*Primary Examiner* — Guerrier Merant
(74) *Attorney, Agent, or Firm* — Miles & Stockbridge P.C.

(57) ABSTRACT

A pulse transmission technique is used for wireless communication between a microcomputer (13) having a debugging support circuit (17) and a debugger (13). The pulse transmission technique is based on magnetic field coupling between a first coil (14) provided for the microcomputer and a second coil (8) coupled with the debugger. During an initialization operation, the microcomputer performs a process of configuring a communication condition of the wireless communication to perform the wireless communication. The microcomputer awaits control from the debugger when the microcomputer establishes communication with the debugger. The debugger awaits establishment of the communication and proceeds to control of the microcomputer in accordance with the wireless communication. It is possible to provide contactless interface for system debugging without the need for a large antenna or a large-scale circuit for modulation and demodulation.

34 Claims, 27 Drawing Sheets

U.S. PATENT DOCUMENTS

| | | | |
|---|---|---|---|
| 6,830,379 B2 * | 12/2004 | Morita et al. | 384/448 |
| 7,509,250 B2 * | 3/2009 | Cruzado et al. | 703/28 |
| 7,937,636 B2 * | 5/2011 | Dembo | 714/733 |
| 8,004,407 B2 * | 8/2011 | Trosper | 340/571 |
| 2002/0041235 A1 * | 4/2002 | Van Horn et al. | 340/654 |
| 2004/0005859 A1 * | 1/2004 | Ghercioiu et al. | 455/3.01 |
| 2004/0197101 A1 * | 10/2004 | Sasser et al. | 398/117 |
| 2007/0029994 A1 * | 2/2007 | Dembo | 324/158.1 |
| 2007/0044158 A1 * | 2/2007 | Cruzado et al. | 726/27 |
| 2007/0238417 A1 * | 10/2007 | Bennett | 455/69 |
| 2008/0002691 A1 * | 1/2008 | Qi et al. | 370/390 |
| 2010/0296409 A1 * | 11/2010 | Fok et al. | 370/252 |
| 2012/0188927 A1 * | 7/2012 | Bennett | 370/311 |

FOREIGN PATENT DOCUMENTS

| | | |
|---|---|---|
| JP | 2005-182209 A | 7/2005 |
| JP | 2005-345802 A | 12/2005 |
| JP | 2006-51343 A | 2/2006 |

* cited by examiner (offset unavailable)

(offset available)

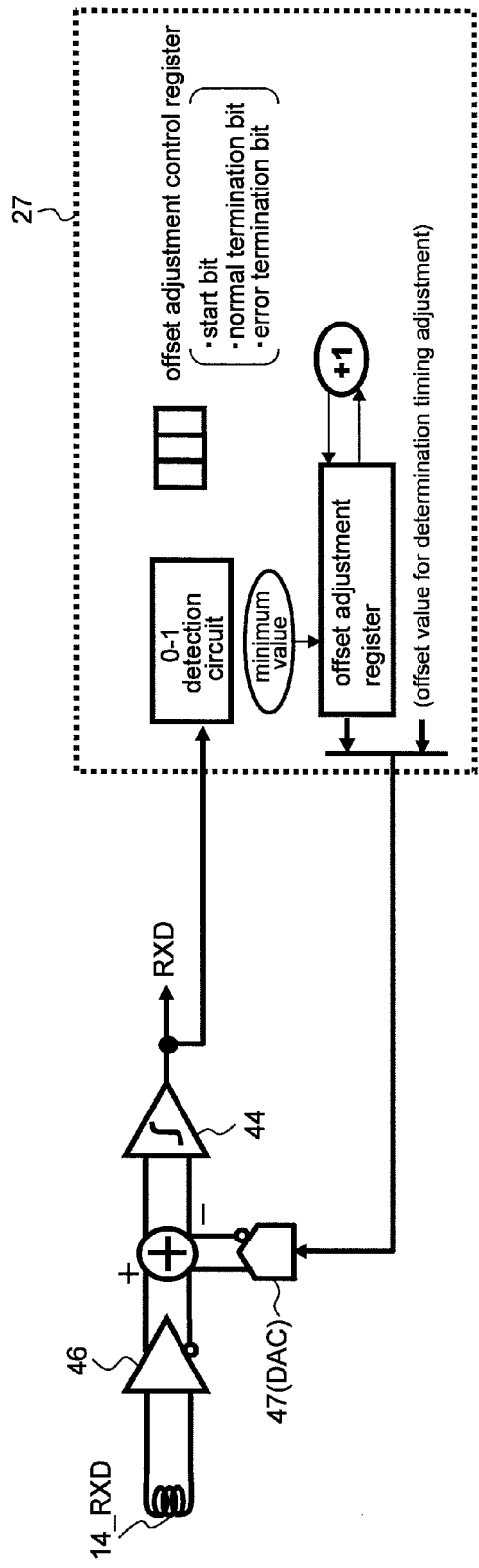

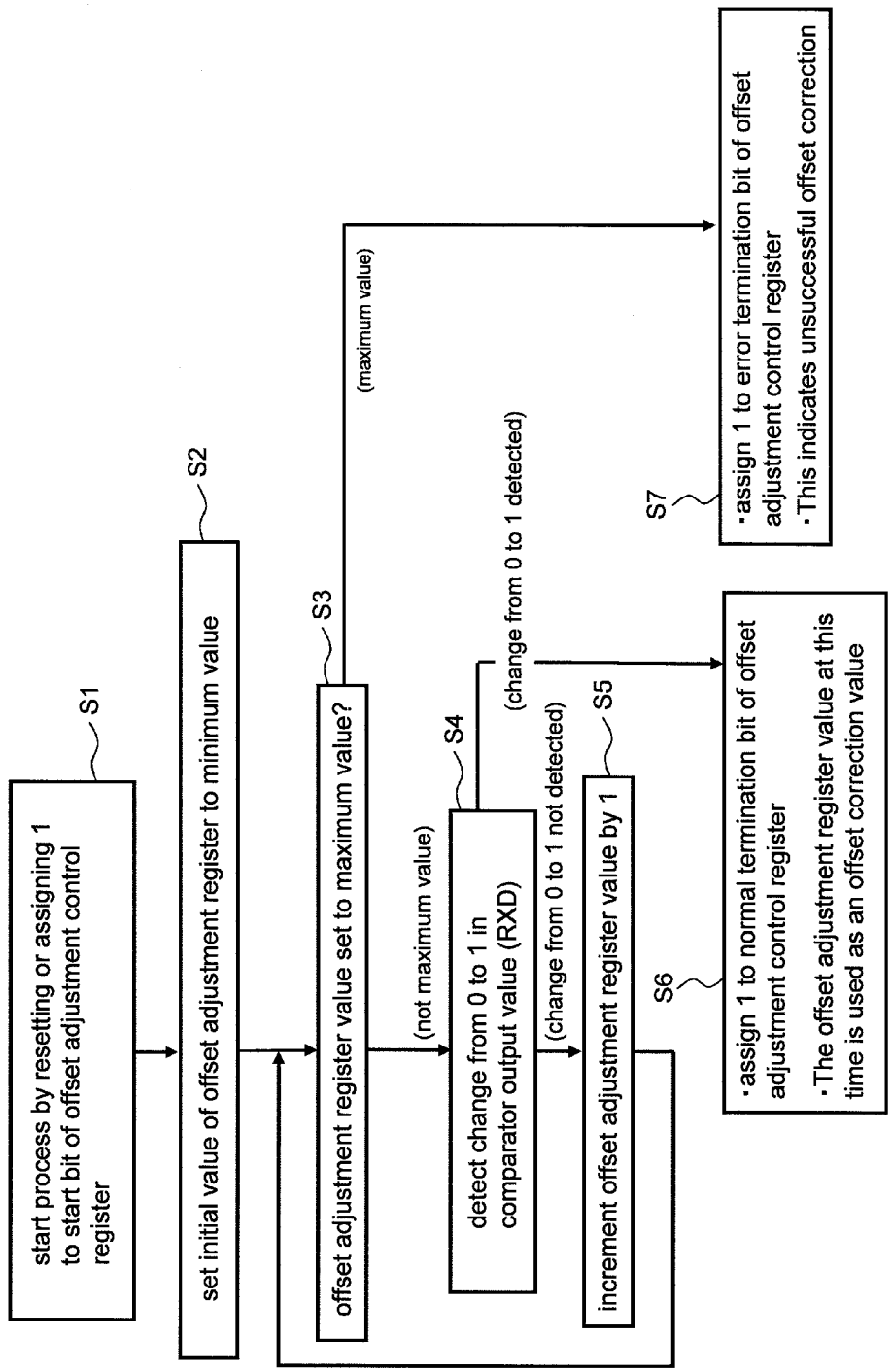

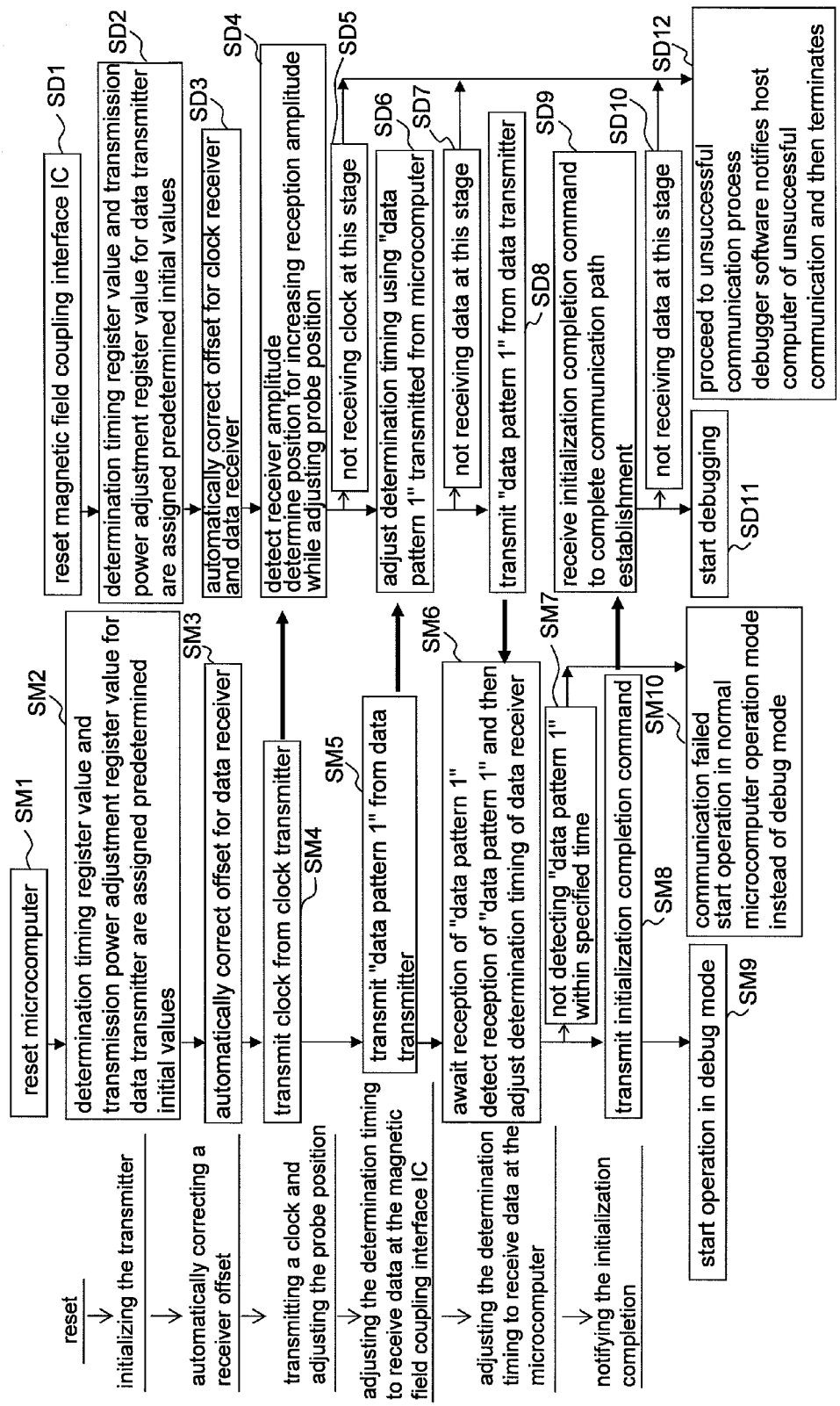

SYSTEM DEBUGGING METHOD, SYSTEM DEBUGGING EQUIPMENT, PROCESSOR, WIRELESS-COMMUNICATIONS INTERFACE IC AND INTERFACE METHOD THEREOF

TECHNICAL FIELD

The present invention relates to an interface technology using magnetic field coupling of a coil and specifically to a close coupling contactless interface technology. For example, the invention relates to a technology effectively applicable to a system debugging that evaluates a target system using a debugger.

BACKGROUND ART

In addition to a wired communication interface using a cable, a wireless-communications interface using wireless communication is available as the technology of interfacing a debugger for system debugging with a target system. The technology described in Patent Document 1 uses wireless communication for interfacing an IC card reader to an interface cable having an antenna coil so as to debug a microcomputer for an IC card having a contactless interface. The technologies described in Patent Documents 2 and 3 provide a wireless-communications interface circuit for a target microcomputer coupled with a debugger and enable a system debugging using wireless communication. The use of the wireless communication for the system debugging makes it possible to evaluate the target system without dedicating a coupling terminal between the target system and the microcomputer to the evaluation.

The wireless communication systems for contactless IC cards include a close coupling type based on electromagnetic coupling as specified in ISO/IEC10536 and a proximity type based on electromagnetic induction as specified in ISO/IEC14443. The contactless interface according to these standards transmits information by performing complicated modulation using a carrier.

Patent Document 1: Japanese Unexamined Patent Publication No. 2003-5994
Patent Document 2: Japanese Unexamined Patent Publication No. 2005-182209
Patent Document 3: Japanese Unexamined Patent Publication No. 2005-18703

DISCLOSURE OF THE INVENTION

Problems to be Solved by the Invention

The wireless-communications interface for close coupling IC cards ensures a communication distance of several millimeters. According to IC card capabilities, even such interface transmits information modulated by PSK (Phase Shift Keying) from the viewpoint of ensuring the security. The same applies to the proximity wireless-communications interface whose maximum communication distance reaches several tens of centimeters. As disclosed in the above-mentioned Patent Documents, the conventional wireless-communications interface used for system debugging also transmits information through the complicated modulation using carriers.

In many cases, however, the system debugging needs to ensure lower security than that for IC cards. In addition, the system debugging is needed only for the development stage of a target system and is hardly needed after the development. Recently, it is a general practice to provide a debugging support feature for a microcomputer (production chip) actually used for the target system without providing a microcomputer (evaluation chip) dedicated to the system debugging. Accordingly, from the viewpoint of costs, a small physical scale or a small chip footprint is also desirable for a debugging interface circuit only used for the development stage. In this sense, the inventors found that the contactless interface for system debugging gives preference to elimination of a large antenna or a large-scale circuit for modulation and demodulation as well as low power consumption. That is, a long communication distance consumes a large amount of power and requires a large antenna. The need for a large antenna decreases the degree of freedom for mounting the antenna over a chip or a package. A relatively high frequency signal needs to be sued for a carrier when the modulation varies carrier parameters (phase, frequency, amplitude, and the like) in accordance with an information signal. An advanced analog design technology is needed. The circuit scale drastically increases. The power consumption greatly increases. When the advanced analog design technology is needed, the contactless interface circuit needs to be redesigned for different process technologies. The development cost also increases. Further, it is difficult to change a wireless communication rate in accordance with internal states of the microcomputer. For example, there may be a case where trace information inside the microcomputer is supplied to a debugger via the wireless-communications interface when a lower power consumption state is enabled. In such case, there may be a decrease in the operating frequency for generating the information to be traced. It is difficult to accordingly decrease a carrier frequency for the wireless-communications interface.

It is an object of the present invention to provide a technology capable of contactless interface for system debugging without the need for a large antenna or a large-scale circuit for modulation and demodulation.

It is another object of the present invention to provide a technology capable of reducing costs for a contactless interface used for system debugging.

These and other objects and novel features of the invention may be readily ascertained by referring to the following description and appended drawings.

Means for Solving the Problems

The following summarizes representative aspects of the present invention disclosed in the specification.

That is, a pulse transmission technique is used for wireless communication between a microcomputer having a debugging support circuit and a debugger. The pulse transmission technique is based on magnetic field coupling by oppositely placing a first coil included in the microcomputer and a second coil included in the debugger. During an initialization operation, the microcomputer performs a process of configuring a communication condition of the wireless communication to perform the wireless communication. The microcomputer awaits control from the debugger when the microcomputer establishes communication with the debugger. The debugger awaits establishment of the communication and proceeds to control of the microcomputer in accordance with the wireless communication.

The pulse transmission technique based on the magnetic field coupling embodies the physically small-scale and low-cost wireless communication. The microcomputer autonomously establishes communication conditions and then is capable of performing a control operation for the system debugging in accordance with control from the debugger.

Effects of the Invention

The following summarizes effects resulting from the representative aspects of the present invention disclosed in the specification.

It is possible to provide contactless interface for system debugging without the need for a large antenna or a large-scale circuit for modulation and demodulation.

It is possible to reduce costs for a contactless interface used for system debugging and the like.

BRIEF DESCRIPTION OF THE DRAWINGS

FIG. 9 is an explanatory diagram exemplarily showing an overview of an automatic offset adjustment method using an input from the comparator in FIG. 6;

FIG. 10 is a process flow of the automatic offset adjustment method;

FIG. 21 is a flow chart exemplarily showing a communication path establishment procedure when the system starts;

DESCRIPTION OF REFERENCE NUMERALS

Figure 1:
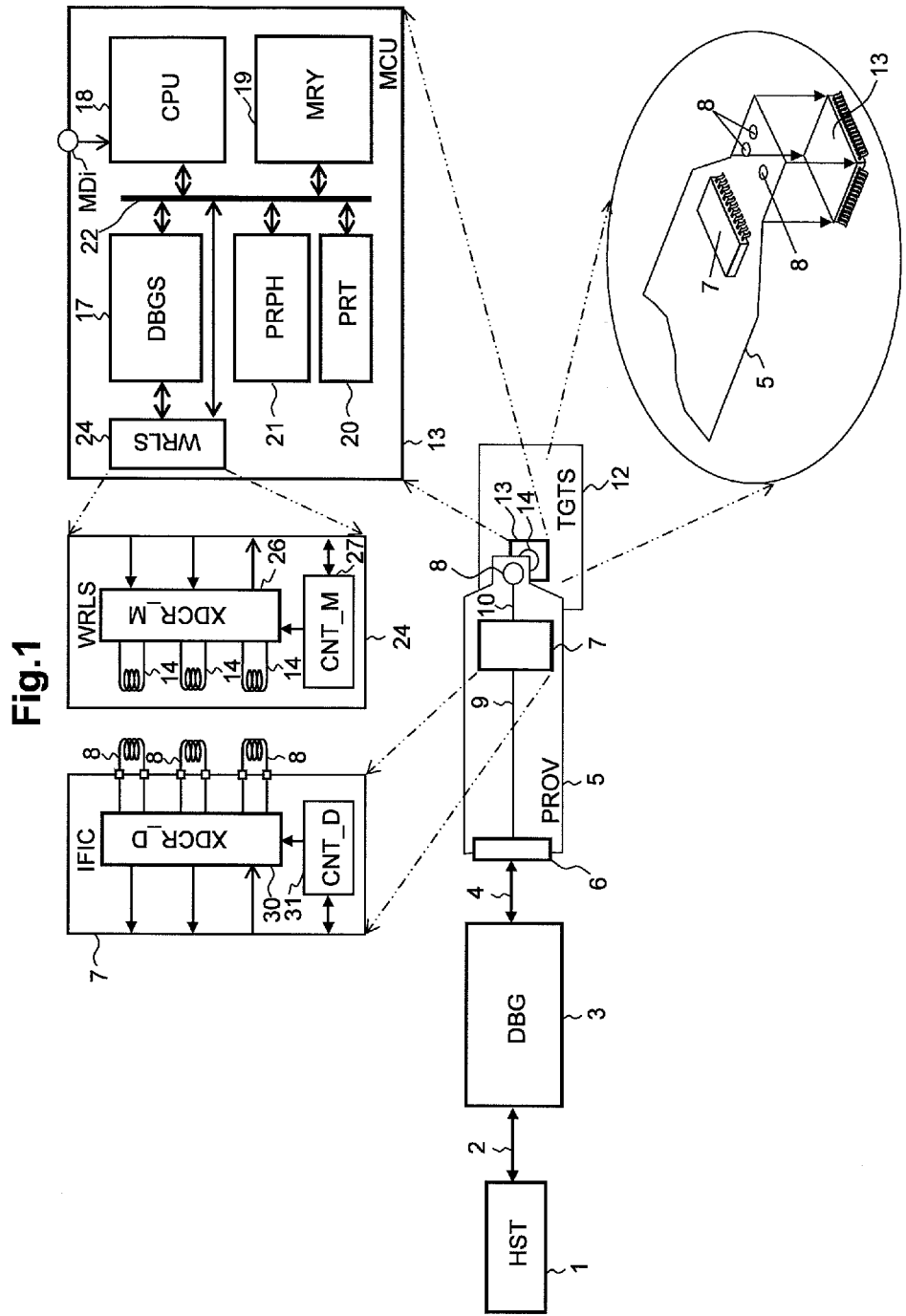
FIG. 1 is an overall configuration diagram of a system capable of using the system debugging method according to the invention.

1—host computer (HOST)
2—interface cable
3—debugger (DBG)
5—probe
5TOP—tip of probe 5
7—magnetic field coupling interface IC (IFIC)
8—coil for wireless-communications interface (second coil)
12—target system (TGTS)
13—microcomputer (MCU)
14—coil for wireless-communications interface (first coil)
17—debugging support circuit (DBGS)
18—central processing unit (CPU)
24—wireless-communications interface circuit
16—transceiver circuit (XDCR_M)
27—control circuit (CNT_M)
30—transceiver circuit (XDCR_D)
31—control circuit (CNT_D)
MDi—mode terminal

BEST MODE FOR CARRYING OUT THE INVENTION

1. Representative Embodiments

The following describes overviews of representative embodiments disclosed in the present application. Parenthesized reference numerals in the drawings are contained in the overview of the representative embodiment and just exemplarily show instances contained in the concept of constituent elements assigned the reference numerals.

<1> System Debugging Method

The system debugging method uses a debugger (3) to control a microcomputer (13) including a debugging support circuit (17) that supports the system debugging. The system debugging method performs wireless communication between the microcomputer and the debugger based on a pulse transmission technique using magnetic field coupling in which a first coil (14) provided for the microcomputer and a second coil (8) coupled with the debugger are placed opposite to each other. As an initial operation of the wireless communication, the microcomputer performs processes (SM2, SM3, and SM6) of configuring communication conditions for the wireless communication. When establishing the communication with the debugger, the microcomputer awaits control from the debugger via a debugger support circuit (SM9). The debugger awaits establishment of the communication and then proceeds to the control under the microcomputer using the wireless communication (SD11). For example, the pulse transmission technique transmits information based on pulse voltage polarities. As mentioned above, the system debugging method uses the pulse transmission technique based on the magnetic field coupling. The wireless communication does not need a large-scale modulation and demodulation circuit or a large antenna. When the operating frequency varies with operation mode of the microcomputer, the pulse transmission technique can flexibly respond to frequency changes of a transmission pulse as the very information to be transmitted. When the modulation is performed for the wireless communication, the carrier frequency needs to be variable so as to respond to changes in an operation reference clock frequency of the microcomputer. The circuit scale increases. Otherwise, the system debugging is infeasible in a low power consumption state. Accordingly, the pulse transmission technique based on the magnetic field coupling embodies the physically small-scale and low-cost wireless communication. In addition, the microcomputer autonomously establishes communication conditions during an initial operation enabled by a power-on sequence or the like and then is capable of performing a control operation for the system debugging in accordance with control from the debugger.

As a specific mode, the debugger performs wireless communication with the microcomputer via a magnetic field coupling interface IC (7) having a second transceiver circuit (30) and a second control circuit (31). The second transceiver circuit is coupled with the second coil at one side and with the debugger at the other side. The second control circuit is coupled with the debugger and provides the second transceiver circuit with a communication condition based on the magnetic field coupling. The microcomputer wirelessly communicates with the debugger through operations of a first transceiver circuit (26) coupled with the first coil and a first control circuit (27) that provides the first transceiver circuit with a communication condition based on the magnetic field coupling. It is possible to independently configure communication conditions about the wireless communication functions for the debugger and the microcomputer when no wireless communication is established between the debugger and the microcomputer.

As another specific mode, the microcomputer performs the wireless communication using the first coil formed in a conductive layer over the semiconductor integrated circuit chip configuring the microcomputer. Since a large antenna coil is unnecessary, the semiconductor integrated circuit chip can contain an antenna coil. It is possible to eliminate an external antenna terminal for the debugging support circuit that is only needed for debugging. The first coil may be placed at a corner of the semiconductor integrated circuit chip. This decreases an overlap between the first coil and a bonding wire, making it possible to restrain unintended induction therebetween. The first coil may be formed inside a microcomputer package and outside the semiconductor integrated circuit chip.

The debugger performs the wireless communication using the second coil formed in an interfacing flexible substrate where the magnetic field coupling interface IC is mounted and an interface wiring is formed for coupling the mounted magnetic field coupling interface IC with the debugger. Alternatively, the debugger performs the wireless communication using the second coil formed in the conductive layer over the semiconductor integrated circuit chip forming the magnetic field coupling interface IC. In either case, the interfacing flexible substrate includes the wireless-communications interface function of the debugger. The debugger itself is easily applicable to the system debugging that may use the wireless-communications interface or the wired communication interface.

As still another specific mode, the wireless communication is performed using the first and second coils that include independent transmission and reception coils. The communication control is simpler than using the same coil for transmission and reception. A communication rate can be increased because the transmission and the reception can be performed in parallel. For example, the wireless communication is performed using the first coils (14_CLK, 14_TXD, and 14_RXD) specialized for clock transmission, data transmission, and data reception and the second coils (8_CLK, 8_TXD, and 8_RXD) specialized for clock reception, data transmission, and data reception. In this manner, the clock-synchronized wireless communication is available. Further, the microcomputer transmits a synchronization clock. When an operation clock frequency of the microcomputer itself varies with the operation mode of the microcomputer, a synchronization clock frequency for the wireless-communications interface with the debugger can be easily adjusted to the operation mode of the microcomputer. It is possible to easily control a debugging operation or the like for tracing an internal state of the microcomputer. As another example, asynchronous communication may use the first coils (14_TXD and 14_RXD) specialized for data transmission and data reception and the second coils (8_TXD and 8_RXD) specialized for data transmission and data reception.

It is desirable to determine distances between the coils specialized for clock transmission, data transmission, and data reception so as to maximize the distance between the clock transmission coil and any other coil. This is effective in terms of preventing the possibility of distorting the clock waveform due to the mutual induction because the clock is always transmitted in parallel with data transmission or reception. There may be a need for restraining unwanted induction with a bonding wire of the semiconductor integrated circuit chip. In consideration for this, the coil may be preferably placed near the bonding wire coupled with a signal terminal such as a power supply terminal, ground terminal, or mode terminal that ensures a constant level.

As yet another specific mode, the first control circuit settles the communication condition using a result of adjusting an offset for a differential output from an reception amplifier (44) in the first transceiver circuit. The second control circuit settles the communication condition using a result of adjusting an offset for a differential output from a reception amplifier (56 or 59) in the second transceiver circuit. Adjusting the amplifier offset improves the wireless communication reliability.

The first control circuit settles the communication condition using a result of a determination timing adjustment for output from the reception amplifier in the first transceiver circuit. The second control circuit settles the communication condition using a result of a determination timing adjustment for output from the reception amplifier in the second transceiver circuit. Both the debugger and the microcomputer can easily accomplish clock-synchronized reception operation using the common clock signal.

When the wireless communication synchronizes with the clock, the first transceiver circuit transmits a clock signal. As the communication condition, the second control circuit measures the intensity of determination signal amplitude from a comparator (55) that is included in the second transceiver circuit and determines a logical value for the received clock signal. The magnetic field coupling attenuates a reception waveform. The received clock waveform can be recovered by providing an appropriate threshold value used for determining the amplitude size.

When the wireless communication is asynchronously performed without using the clock signal, the first control circuit settles the communication condition by measuring the intensity of determination signal amplitude from a comparator (44_A) that is included in the first transceiver circuit and determines a logical value for the received signal. The second control circuit settles the communication condition by measuring the intensity of determination signal amplitude from a comparator (57_B) that is included in the second transceiver circuit and determines a logical value for the received signal. The received signal waveform can be recovered.

For example, the determination signal amplitude intensity can be measured by gradually increasing hysteresis characteristics of the comparator and determining whether or not an output pulse from the comparator can recover the clock. A hysteresis characteristic value at the boundary can indicate the amplitude intensity. Measuring a duty value for an output waveform from the comparator can provide the method of determining whether or not the clock can be recovered.

As still yet another specific mode, the microcomputer and the debugger acknowledge establishment of the communication under the condition that one party transmits specified data to the other party and the other party can recognize the data, and vice versa. It is possible to easily determine whether or not the communication is established.

<2> System Debugging Equipment

System debugging equipment is equivalent to a system that is coupled with the microcomputer (13) having a debugging support circuit (24) for supporting the system debugging and is used for the system debugging of a target system (12) controlled by the microcomputer. The system debugging equipment includes the second coil (8) and the debugger (3) coupled with the second coil (8). The second coil is provided opposite the first coil (14) included in the microcomputer and is capable of magnetic field coupling. The debugger uses the magnetic field coupling to perform the wireless communication based on the pulse transmission technique with the microcomputer. The pulse transmission technique based on the magnetic field coupling embodies the physically small-scale and low-cost wireless communication.

As a specific mode, the magnetic field coupling interface IC (7) includes a transceiver circuit (30) and a control circuit (31). The transceiver circuit is coupled with the second coils at one side and with the debugger at the other side. The control circuit is coupled with the debugger and provides the transceiver circuit with a communication condition based on the magnetic field coupling. The debugger itself need not have the wireless-communications interface function based on the magnetic field coupling in accordance with the pulse transmission technique. It is possible to use the same debugger as for the wired communication. For example, it may be preferable to use an interfacing flexible substrate (5) that is mounted with a magnetic field coupling interface IC and formed with an interface wiring for coupling the mounted magnetic field coupling interface IC with the debugger. The second coil 2 may be formed to be provided for the interfacing flexible substrate or the conductive layer of the semiconductor integrated circuit chip for forming the magnetic field coupling interface IC.

As another specific mode, a tip (5TOP) of the interfacing flexible substrate has a planar shape similar to a planar shape of the package for the microcomputer. It is possible to oppositely position the first and second coils to be subject to magnetic field coupling just by detachably placing the package for the microcomputer so as to be aligned to the shape of the tip of the interfacing flexible substrate.

As mentioned above, the debugging equipment may be configured to use the second coils specialized for transmission and reception and the second coils specialized for clock reception, data transmission, and data reception. The communication condition may be configured to: settle a result of adjusting an offset for a differential output from the reception amplifier; settle a result of adjusting a determination timing for output from the reception amplifier in the transceiver circuit: or measure the intensity of determination signal amplitude from the comparator that is included in the transceiver circuit and determines a logical value for the received signal.

<3> Microcomputer

The microcomputer includes a central processing unit (18), a debugging support circuit (17), and a wireless-communications interface circuit (24). The central processing unit performs instructions. The debugging support circuit is coupled with the central processing unit and supports the system debugging. The wireless-communications interface circuit is coupled with the debugging support circuit and performs wireless communication with the outside. The wireless-communications interface circuit includes the transceiver circuit (26) and the control circuit (27). The transceiver circuit performs wireless communication based on magnetic field coupling using the coils in accordance with the pulse transmission technique. The control circuit provides the transceiver circuit with a communication condition. The control circuit settles the communication conditions (SM2, SM3, and SM6) during an initial operation of the microcomputer, recognizes a response to a signal transmitted from the transceiver circuit to the outside (SM6), whereby the control circuit uses the transceiver circuit to notify the outside of the initialization completion (SM8). The central processing unit starts operating after a wait for an instruction from the transceiver circuit. The pulse transmission technique based on the magnetic field coupling embodies the physically small-scale and low-cost wireless communication. In addition, the microcomputer autonomously establishes communication conditions during an initial operation enabled by a power-on sequence or the like and then is capable of performing a control operation for the system debugging in accordance with control from the debugger.

As a specific mode, the transceiver circuit includes a transmission driver, a reception amplifier, and a comparator. The transmission driver drives a transmission coil. The reception amplifier amplifies a current flowing through a reception coil. The comparator determines a logical value for a reception signal from the reception amplifier. Similarly to the above, the control circuit may settle the communication condition by adjusting an offset for a differential output from the reception amplifier, adjusting a determination timing for output from the reception amplifier, or measuring the intensity of determination signal amplitude from the comparator. Similarly to the above, coils specialized for clock reception, data transmission, and data reception may be formed so as to be provided for the conductive layer over the semiconductor integrated circuit chip where the microcomputer is formed. The maximum distance may be configured between the clock reception coil and any other coil. Alternatively, the coil may be placed at a corner of the semiconductor integrated circuit chip. The first coil may be formed inside the microcomputer package and outside the semiconductor integrated circuit chip.

<4> Wireless-Communications Interface IC

The wireless-communications interface IC includes a host interface terminal and a transceiver circuit. The transceiver circuit is coupled with the host interface terminal at one side and with a coil at the other side and performs wireless communication based on magnetic field coupling using the coil in accordance with the pulse transmission technique. The control circuit supplies the transceiver circuit with a communication condition during an initialization operation. The control circuit enables the host interface terminal to reference the negative or affirmative determination concerning a signal received from the transceiver circuit via the coil and the negative or affirmative response to a signal transmitted from the transceiver. A host device such as a debugger, a tester, or an EPROM writer may control a target device such as the microcomputer through the wireless communication using the pulse transmission technique based on the magnetic field coupling. In such case, the wireless-communications interface IC can be used to easily provide the host device with a wireless-communications interface.

<5> Interface Method

The interface method is used for the host device to control the microcomputer. The interface method enables wireless communication between the microcomputer and the host device in accordance with the pulse transmission technique based on the magnetic field coupling between the first coil provided for the microcomputer and the second coil coupled with the host device. During an initialization process, the microcomputer performs a process for settling a communication condition about the wireless communication. When establishing the communication with the host device, the microcomputer awaits control from the host device. The host device awaits establishment of the communication and proceeds to control over the microcomputer using the wireless communication. Accordingly, the pulse transmission technique based on the magnetic field coupling embodies the physically small-scale and low-cost wireless communication. In addition, the microcomputer autonomously establishes communication conditions during an initial operation enabled by a power-on sequence or the like and then is capable of performing a control operation in accordance with an instruction from the host device such as the tester or the EPROM writer.

2. Embodiment Description

The following describes the embodiment in more detail.

FIG. 1 exemplarily shows an overall system configuration capable of using the system debugging method according to the invention. A host computer (HOST) 1 such as a personal computer is coupled with a debugger (DBG) 3 through an interface cable 2. The debugger 3 is coupled with a connector 6 of a probe 5 through a debugger cable 4. The probe 5 is made of an interfacing flexible substrate and is mounted with a magnetic field coupling interface IC (IFIC) 7 and a coil (second coil) 8 for wireless-communications interface. The magnetic field coupling interface IC 7 is coupled with the connector 7 through an interface wiring 9 at one side and with the coil 8 through an interface wiring 10 at the other side. The interfacing flexible substrate uses resin as a base material, for example.

A target system (TGTS) 12 is targeted for system debugging and includes a microcomputer (MCU) 13. The microcomputer 13 includes a coil (first coil) 14 for wireless-communications interface. The pulse transmission technique is used to perform wireless communication between the microcomputer 13 and the debugger 3 based on magnetic field coupling between the coil 14 included in the microcomputer 13 and the coil 8 coupled with the debugger while both coils are placed opposite to each other.

The microcomputer 13 includes a debugging support circuit (DBGS) 17 for supporting the system debugging, a central processing unit (CPU) 18, memory (MRY) 19 such as RAM (random access memory) and ROM (read only memory), an input/output port (PRT) 20, and the other peripheral circuits (PRPH) 21. These circuit modules are coupled with a representatively illustrated internal bus 22 in common. For example, the CPU 18 fetches an instruction in accordance with a program contained in the memory 19. The CPU 18 decodes the fetched instruction, accesses operands or performs arithmetic processing in accordance with the result, and thus processes data specified by the instruction. The debugging support circuit 17 can interface with the debugger using a wireless-communications interface circuit (WRLS) 24 having the coil 14. Although not limited to the following, the debugging support circuit 17 is used for breakpoint control in accordance with an instruction from the debugger, trace point control, and interface control with the debugger when a break interrupt is enabled, for example.

The wireless-communications interface circuit 24 is included in the microcomputer 13 whose configuration is outlined in FIG. 1. In addition to the coil 14, the wireless-communications interface circuit 24 includes a transceiver circuit (XDCR_M) 26 coupled with the coil 14 and a control circuit (CNT_M) 27 that provides the transceiver circuit 26 with a communication condition based on the magnetic field coupling. The control circuit 27 receives control from the CPU 18. FIG. 1 exemplarily shows the three coils 14. The magnetic field coupling interface IC 7 whose configuration is outlined in FIG. 1 includes a transceiver circuit (XDCR_D) 30 and a control circuit (CNT_D) 31. The transceiver circuit (XDCR_D) 30 is coupled with the coil 8 at one side and with the debugger at the other side. The control circuit (CNT_D) 31 is coupled with the debugger 3 and provides the transceiver circuit 30 with a communication condition based on the magnetic field coupling. The control circuit 31 receives control from the debugger 3. FIG. 1 exemplarily shows the three coils 8.

The microcomputer 13 has multiple operation modes that are broadly classified into a debug mode and a real mode. The real mode is an original operation mode of the microcomputer 13. In the real mode as an operation mode, the microcomputer 13 starts executing an instruction from a specified address in the system to be controlled after a reset exception process and disables operations of the debugging support circuit 17. In the debug mode as an operation mode, operations of the debugging support circuit 17 are enabled. After the reset exception process, the microcomputer 13 does not start executing an instruction at a specified address in the system and starts executing the instruction in accordance with a direction from the debugger 3. In many cases, the real mode is further divided into operation modes depending on the memory space size or different low power consumption states. In FIG. 1, MDi denotes a mode terminal assumed to be a one-bit terminal that specifies the debug mode or the real mode. Illustrations of the other signal terminals and power terminals are omitted.

Figure 2:
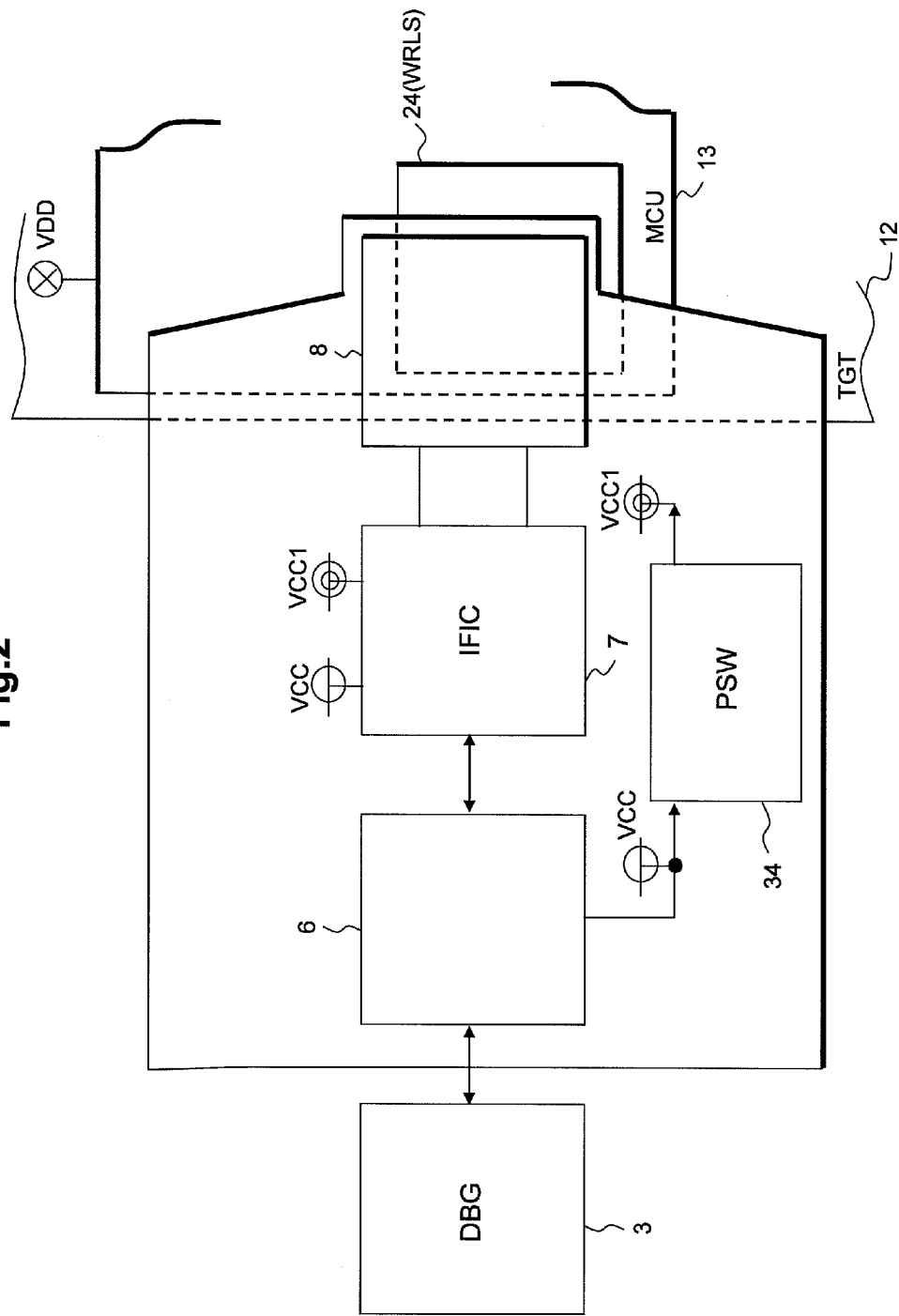
FIG. 2 is an explanatory diagram exemplarily showing an operating power supply of a wireless-communications interface circuit for a microcomputer and an operating power supply of a magnetic field coupling interface IC.

FIG. 2 shows an operating power supply of the wireless-communications interface circuit 24 in the microcomputer 13 and an operating power supply of the magnetic field coupling interface IC 7. The operating power supply of the wireless-communications interface circuit 24 uses an operating power supply voltage VDD supplied from the target system 12 to the microcomputer 13 for the wireless communication between the wireless-communications interface circuit 24 and the magnetic field coupling interface IC 7. The operating power supply of the magnetic field coupling interface IC 7 uses an operating power supply voltage VCC supplied from the debugger 3 and its step-down voltage VCC1. That is, unlike a proximity contactless interface, the wireless communication according to the embodiment does not need a contactless power transmission function based on full-wave rectification of wireless interface signals. Only a contactless signal transmission function is needed. The power supply voltages VDD and VCC1 may or may not match. The wireless communication is performed between the coil 14 of the wireless-communications interface circuit 24 and the coil 8 coupled with the magnetic field coupling interface IC 7 based on magnetic field coupling by placing the corresponding coils opposite to each other within a range of several millimeters. Reference numeral 34 denotes a power supply circuit that steps down the power supply voltage VCC to the power supply voltage VCC1.

Figure 3:
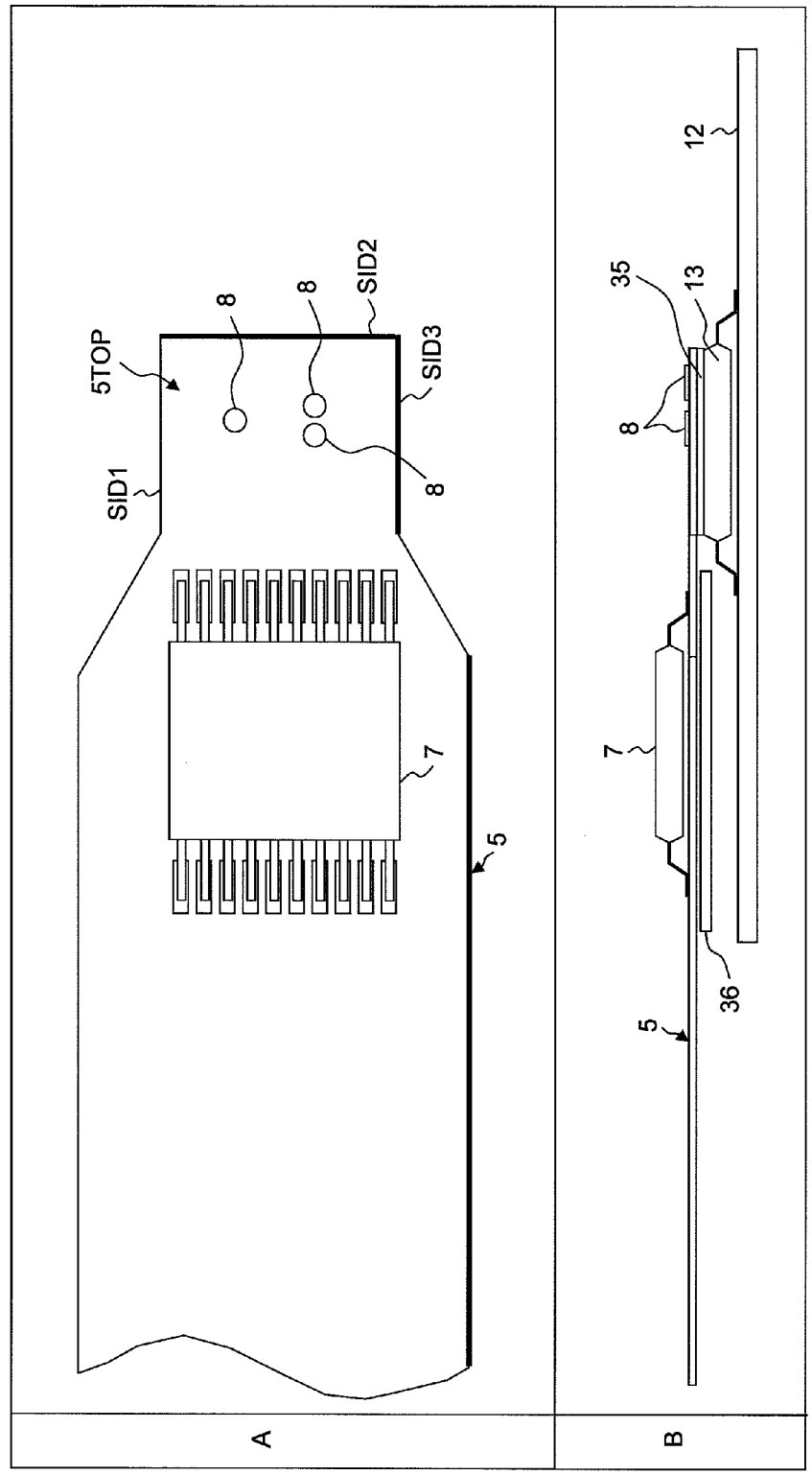
FIG. 3 shows a top view configuration of a probe and a vertically sectional structure diagram when the probe is bonded to a microcomputer.

FIG. 3 exemplarily shows a top view configuration of the probe and a vertically sectional structure when the probe is bonded to the microcomputer. A tip 5TOP of the probe 5 belonging to the interfacing flexible substrate has a shape similar to a planar shape of the package for the microcomputer 13. In FIG. 3A, three sides SID1 to SID3 are shaped so as to be almost equal to lengths of three sides of the package for the microcomputer 13. In FIG. 3A, three coils 8 are formed in accordance with a wiring pattern and are embedded in the interfacing flexible substrate. FIG. 3B is a vertically sectional view that exemplarily shows a state of detachably attaching the tip 5TOP of the probe 5 to the microcomputer 13 of the target system 12. The tip 5TOP of the probe 5 is bonded to the surface of the package of the microcomputer 13 using a double-sided tape 35, for example. The coils 14 of the microcomputer 13 and the coils 8 of the probe 5 are designed so that the corresponding coils 14 and 8 are concentrically positioned opposite to each other when an end edge of the tip 5TOP of the probe is aligned to an end edge of the surface of the package for the microcomputer 13. Both end edges are easily bonded in alignment with each other because the shape of the tip 5TOP is formed almost equally to the planar shape of the package for the microcomputer 13. As a result, it is possible to easily position the corresponding ones of the coils 14 of the microcomputer 13 and the coils 8 of the probe 5 so as to be opposite to each other. This helps improve the reliability of the wireless communication based on the magnetic field coupling. Reference numeral 36 denotes a protective board that prevents the probe 5 from damaging a device or wiring for the target system by contact. A wiring formed for the probe 5 is omitted from FIG. 3.

Figure 4:
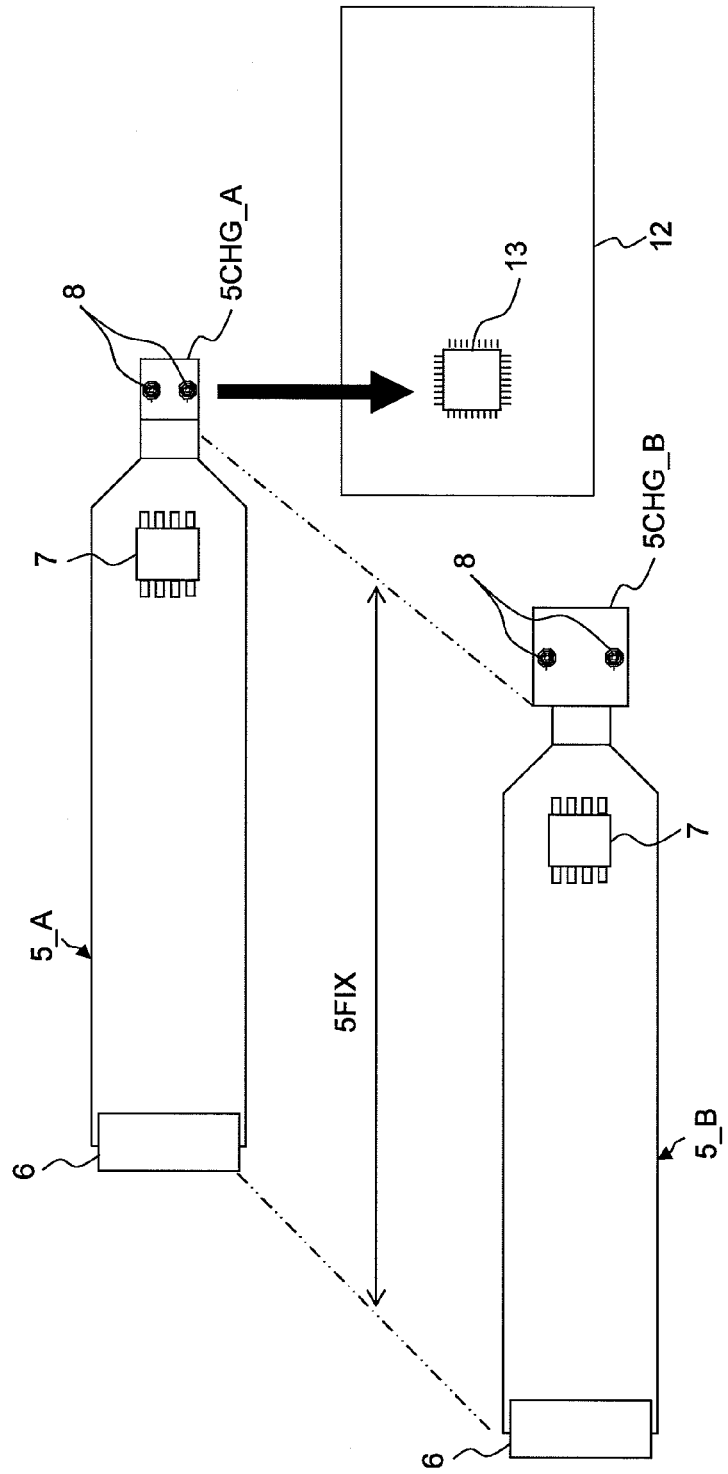
FIG. 4 is a conceptual diagram showing a replacement part used for the tip of the probe.

FIG. 4 is a conceptual diagram showing a replacement part used for the tip of the probe 5. FIG. 4 representatively shows two probes 5_A and 5_B. A portion corresponding to 5FIX covers unchangeable structures and functions. Reference numerals 5CHG_A and 5CHG_B denote coils as replacement parts. The coils 5CHG_A and 5CHG_B are sized to the package size of the microcomputer 13 to be debugged. The coils 5CHG_A and 5CHG_B are arranged so as to meet the arrangement of the coil 8 corresponding to the arrangement of the coil 14 of the microcomputer 13. It just needs to prepare probes with different tips in accordance with the package size of the microcomputer 13 to be debugged.

Figure 5:
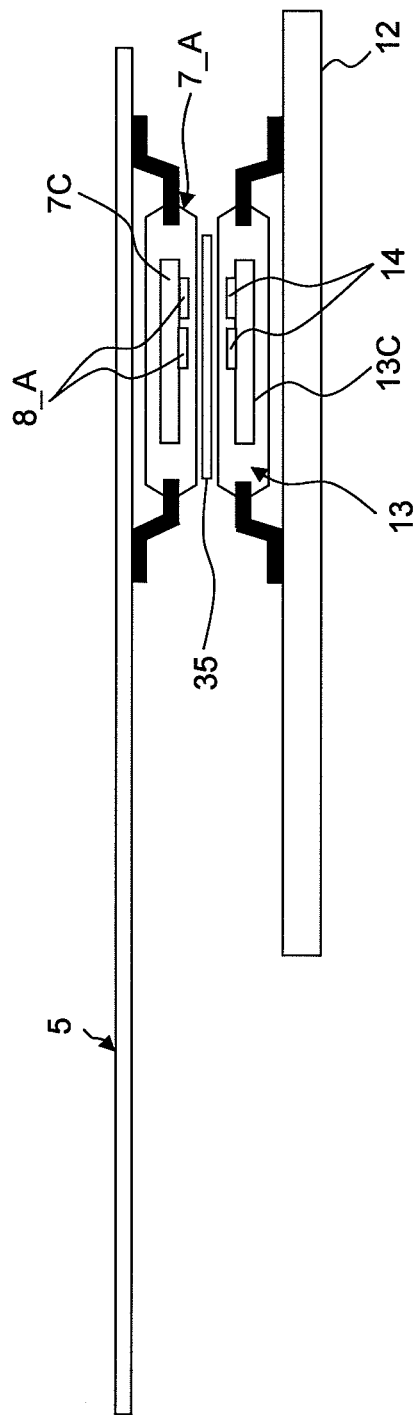
FIG. 5 is a vertically sectional structure diagram showing a coil formed over a semiconductor integrated circuit chip for the magnetic field coupling interface IC.

FIG. 5 exemplarily shows a vertically sectional structure showing a coil 8_A formed over a semiconductor integrated circuit chip 7C of a magnetic field coupling interface IC 7_A. The coil 8_A is configured in accordance with a conductive pattern formed for the semiconductor integrated circuit chip 7C of the magnetic field coupling interface IC 7_A. The semiconductor integrated circuit chip 7C signifies a semiconductor device placed inside the package. As shown in FIG. 3, the coil 8 is sized to be one millimeter by one millimeter when formed over the probe 5 based on a conductive pattern. As shown in FIG. 5, the coil 8_A is reduced to the size of 0.5 millimeters by 0.5 millimeters, for example, when formed over the semiconductor integrated circuit chip 7C of the magnetic field coupling interface IC 7_A. FIG. 5 shows the coil 8_A that is seemingly formed over the surface of the semiconductor integrated circuit chip 7C. The coil 8_A may be fabricated over the surface of an unused wiring layer or top layer of the semiconductor integrated circuit chip.

The coil 8_A of the magnetic field coupling interface IC 7_A can be placed opposite the coil 14 of the microcomputer 13 by using the double-sided tape 35 to detachably fix the surface of the microcomputer 13 opposite the magnetic field coupling interface IC 7_A. The coils 8_A and 14 can be easily positioned by using a common package for the magnetic field coupling interface IC 7_A and the microcomputer 13 or applying the same length to one side of the packages. It may be preferable to predetermine positions of the coils 8_A and 14 relative to the corresponding packages so that the packages are symmetrically placed with reference to a bonding plane of the package.

Figure 6:
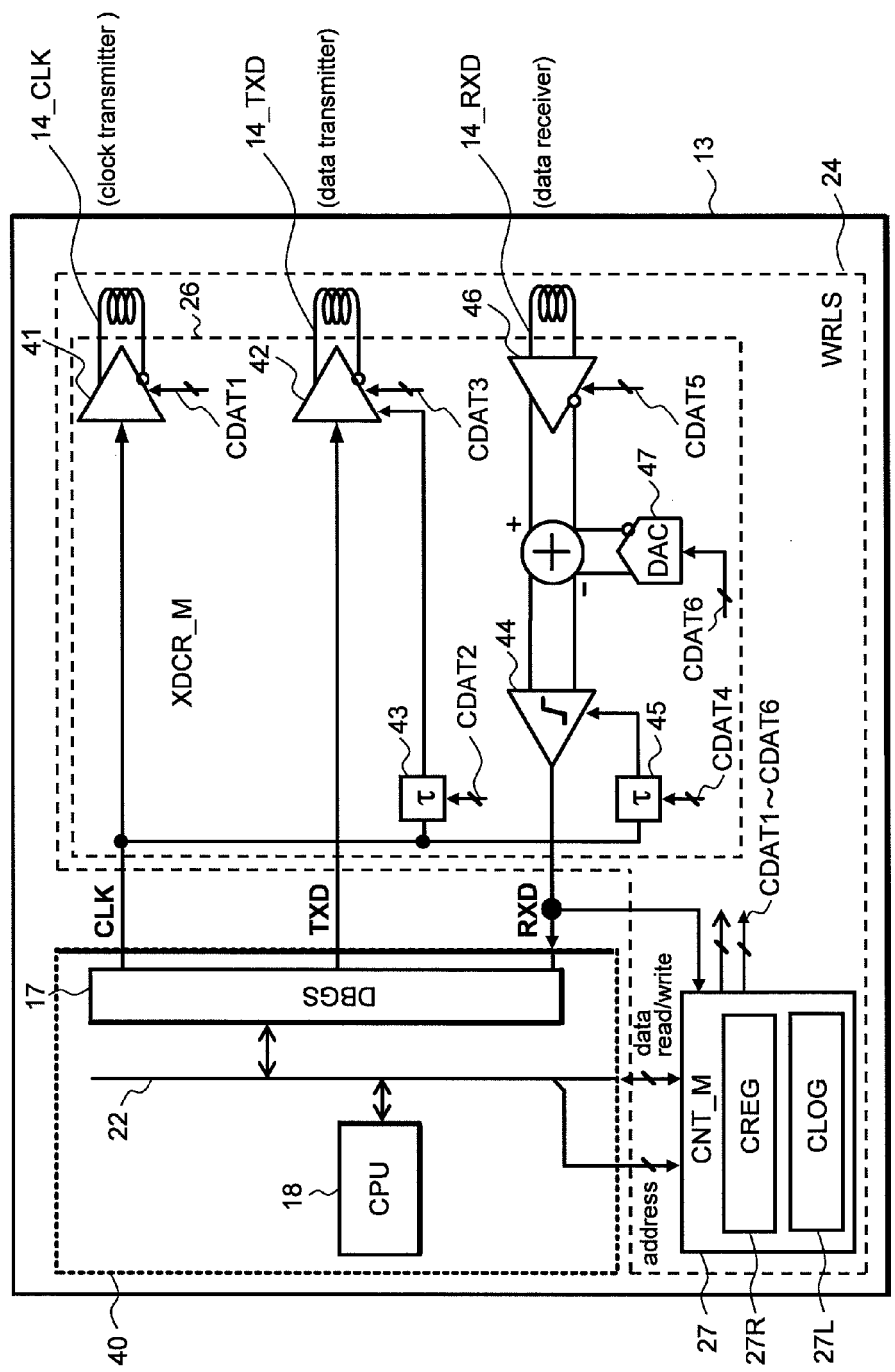
FIG. 6 is a circuit diagram showing an example of the wireless-communications interface circuit included in the microcomputer.

FIG. 6 shows an example of the wireless-communications interface circuit 24 included in the microcomputer 13. A circuit block 40 generically denotes circuits including the CPU 18 other than the wireless-communications interface circuit 24.

The wireless-communications interface circuit 24 transmits information using the pulse transmission technique based on the magnetic field coupling. The pulse transmission technique transmits an information signal based on pulse voltage polarities. According to the embodiment, complementary positive and negative polarities define pulse voltages. Obviously, it may be preferable to transmit information using a single-phase pulse voltage such as the ground level and the positive polarity or the ground level and the negative polarity.

A clock transmitter transmits a clock signal using a clock transmission driver 41 and a clock transmission coil 14_CLK for generating a complementary clock pulse based on a clock signal supplied from the debugging support circuit 17. The clock transmission driver 41 uses differential output for generating a complementary clock pulse. The clock transmission driver 41 uses control data CDAT1 to make output power adjustable.

A data transmitter transmits data using a data transmission driver 42 and a data transmission coil 14_TXD for generating a complementary pulse in accordance with transmission data output from the debugging support circuit 17. A delay circuit (τ) 43 is provided for adjusting transmission timing of a data pulse so as to variably adjust an output timing corresponding to input to the data transmission driver 42. Control data CDAT2 is used to make the delay time adjustable. The data transmission driver 42 uses control data CDAT3 to make output power adjustable.

The data receiver receives data using a data reception coil 14_RXD, a comparator 44, and a delay circuit (τ) 45. The comparator 44 detects modulation information about a reception pulse signal induced by the data reception coil 14_RXD. In this example, the modulation information signifies the positive or negative voltage polarity of a pulse in the complementary two-phase modulation. The delay circuit 45 allows the comparator 44 to generate an optimum detection timing based on a clock CLK supplied from the debugging support circuit. There is also provided a data reception amplifier 46 for amplifying a reception signal of the data reception coil 14_RXD. The data reception amplifier 46 may be provided as needed in accordance with the reception signal intensity (depending on a communication distance or the like) and is omissible. A digital-analog converter circuit (DAC) 47 for offset cancellation is provided to remove a data reception path offset. The output is added as a reverse polarity to complementary output from the data reception amplifier 46. The digital-analog converter circuit 47 is omissible when no offset needs to be removed. Control data CDAT4 is used to make variable the amount of delay for the delay circuit 45. Control data CDAT5 is used to make variable a gain of the data reception amplifier 46. The digital-analog converter circuit 47 converts control data CDAT6 into an analog signal.

The control circuit 27 includes a register circuit (CREG) 27R and a logic circuit (LOG) 27L. The register circuit 27R stores parameters for controlling communication conditions on clock transmission, data transmission, and data reception using control data CDAT1 to CDAT6. The logic circuit 27L controls an operation sequence for assigning parameters to the register circuit. The logic circuit 27L has a function of detecting optimum values for various adjustment parameters. The function may be implemented by software on the host computer via the debugger. In this example, the wireless-communications interface circuit 24 includes the logic circuit 27L as hardware dedicated to the function.

The register circuit 27R is accessible from the debugger 3 via the CPU 18 or the debugging support circuit 17. The register circuit 27R includes: a clock transmission output parameter register that configures a value (CDAT1) for adjusting clock transmission output power; a data transmission output parameter register that configures a value (CDAT3) for adjusting data transmission output power; a data transmission delay parameter register that configures a delay value (CDAT2) for data transmission output timing; a data reception gain parameter register that configures a gain adjustment value (CDAT5) for the data reception amplifier; an offset adjustment register that configures a DAC input value (CDAT6) for offset adjustment; an offset adjustment control register for offset adjustment; a determination timing register that configures a determination timing correction value; a determination timing control register for determination timing adjustment; and a delay amount register that configures a delay amount (CDAT4) for determination timing adjustment.

Figure 7:
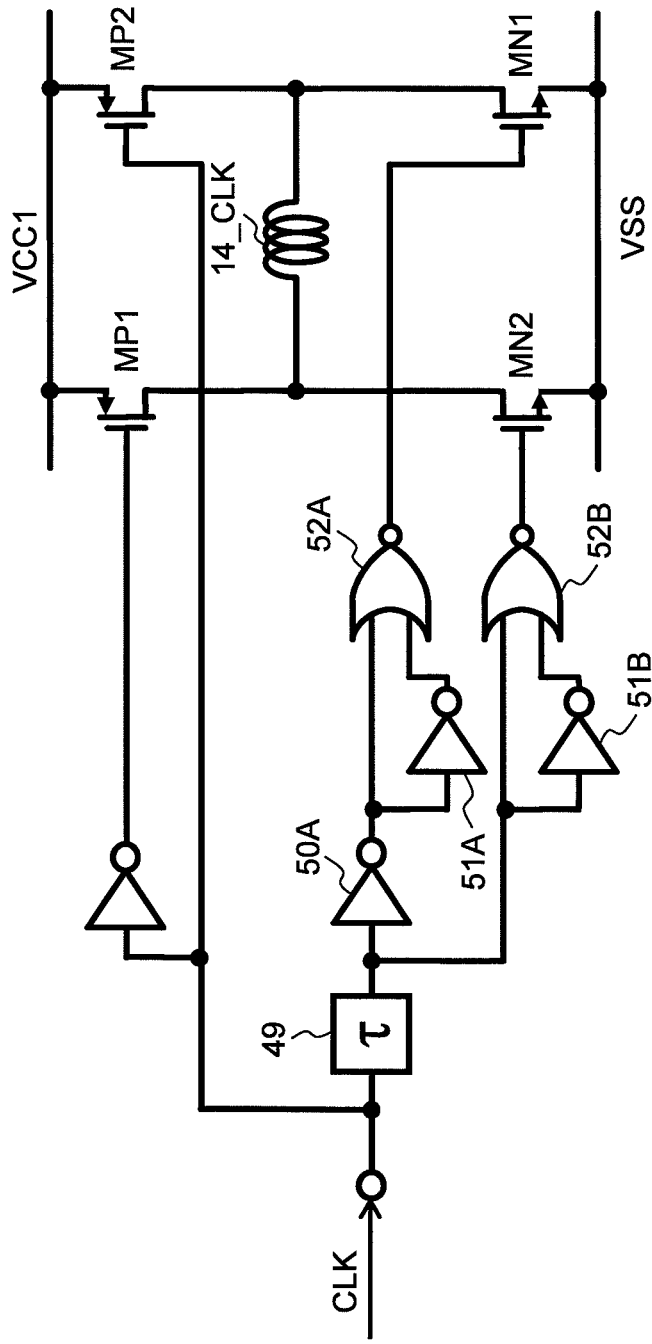
FIG. 7 is a specific circuit configuration diagram using a clock transmission driver and a clock transmission coil.
Figure 8:
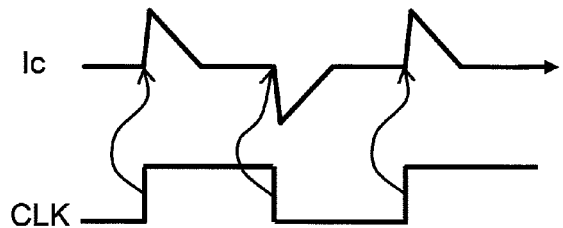
FIG. 8 is a waveform diagram showing a current waveform and a clock signal flowing through the coil.

FIG. 7 exemplarily shows a specific circuit configuration using the clock transmission driver 41 and the clock transmission coil 14_CLK. The coil 14_CLK is supplied with an electric current in synchronization with a rising edge of the clock signal CLK from a p-channel MOS transistor (pMOS transistor) MP1 to an n-channel MOS transistor (nMOS transistor) MN1. The coil 14_CLK is supplied with an electric current in synchronization with a trailing edge of the clock signal CLK from a pMOS transistor MP2 to an NMOS transistor MN2. Reference numeral 49 denotes a fixed delay circuit. Inverters 50A and 51A, and a NOR gate 52A generate a high-level one-shot pulse in synchronization with a rising edge of the clock signal CLK. An inverter 51B and a NOR gate 52B generate a high-level one-shot pulse in synchronization with a trailing edge of the clock signal CLK. FIG. 8 exemplarily shows a waveform of current Ic flowing through the coil 14_CLK and a waveform of the clock signal CLK. Actually, the waveforms gradually attenuate. A circuit using the data transmission driver 42 and the data transmission coil 14_TXD can be also configured similarly.

The simple circuit as shown in FIG. 7 can be used to perform the wireless communication in accordance with the pulse transmission technique. The circuit configuration in FIG. 7 passes an electric current only at the instant of transition of an input signal and is capable of greatly reducing the power consumption. A carrier-based wireless communication technique needs to synchronize a resonance frequency with a carrier frequency by parallel coupling a transmission coil with a capacitor. Normally, it is difficult to assign any values to a carrier frequency and a system clock frequency (communication data rate). Accordingly, a wireless communication technique of fixing the carrier frequency to a synchronization frequency between the coil and the capacitor greatly restricts the degree of freedom to select system clocks (communication data rates). By contrast, the pulse transmission technique eliminates the need for synchronization and makes it possible to select any system clock and data rate.

In many cases, the microcomputer 13 is debugged by using a clock (as is or divided) inside the microcomputer 13 for communication or trace output. Different microcomputer clock frequencies may be used for types of microcomputers or user systems. The wireless-communications interface circuit 24 may employ the wireless communication in accordance with the pulse transmission technique compatible with clock frequencies in the microcomputer. In this manner, the wireless-communications interface circuit 24 can be used for a microcomputer with different operating frequencies. Such wireless-communications interface circuit 24 can be recognized as highly versatile module IP or design property. The microcomputer is often subject to changes in the clock frequency during a user program operation in order to reduce the power consumption. It is preferable to easily change communication rates for the debugging control depending on operating clock frequencies. This improves the usability of the debugging interface function as a debugging control mechanism of the microcomputer.

Figure 11:
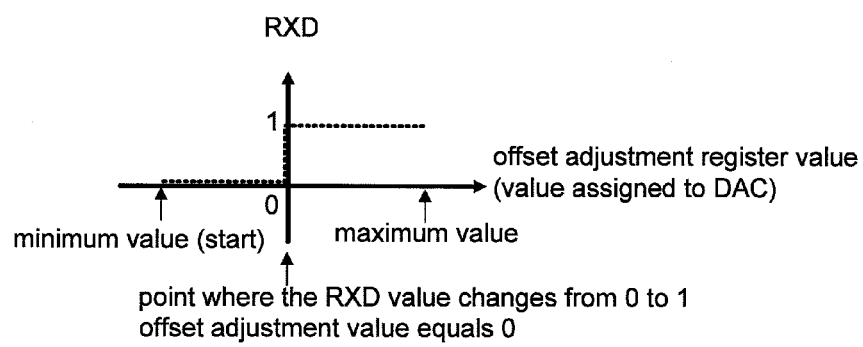
FIG. 11 is an explanatory diagram showing relation between an offset adjustment register value and a detected value RXD when no offset is available.
Figure 12:
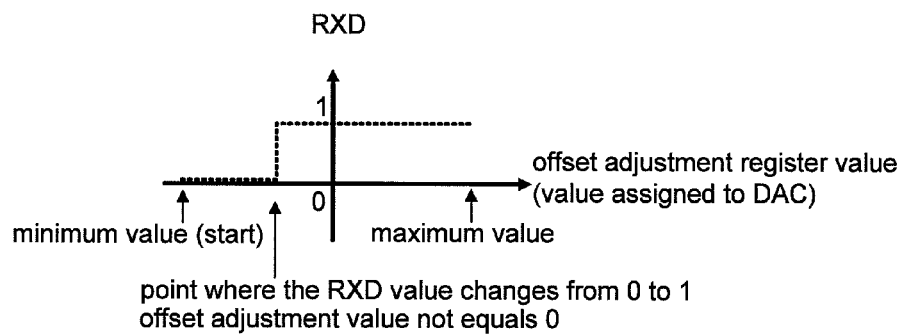
FIG. 12 is an explanatory diagram showing relation between an offset adjustment register value and a detected value RXD when a positive offset is available.

FIG. 9 outlines an automatic offset adjustment method for input to the comparator in FIG. 6. FIG. 10 exemplarily shows a process flow of the automatic offset adjustment method. To cancel a comparator offset, the probe transmits no data. In this state, the method changes an output from the DAC 47 from negative to positive while sequentially incrementing an offset adjustment register value from the minimum value. The method sequentially detects polarities of determination values from the comparator (S1 to S5). When the polarity of a determination value changes from 0 to 1, the value contained in the offset adjustment register is equivalent to a value assigned to the DAC 47 capable of removing the offset (S6). During communication, this value cancels the comparator offset. When the offset adjustment succeeds, 1 is assigned to a normal termination bit of the offset adjustment control register (S6). When the offset adjustment fails, 1 is assigned to an error termination bit of the offset adjustment control register (S7). FIG. 11 shows relation between an offset adjustment register value and a detection value RXD when no offset is available. FIG. 12 shows relation between an offset adjustment register value and a detection value RXD when a positive offset is available.

Figure 13:
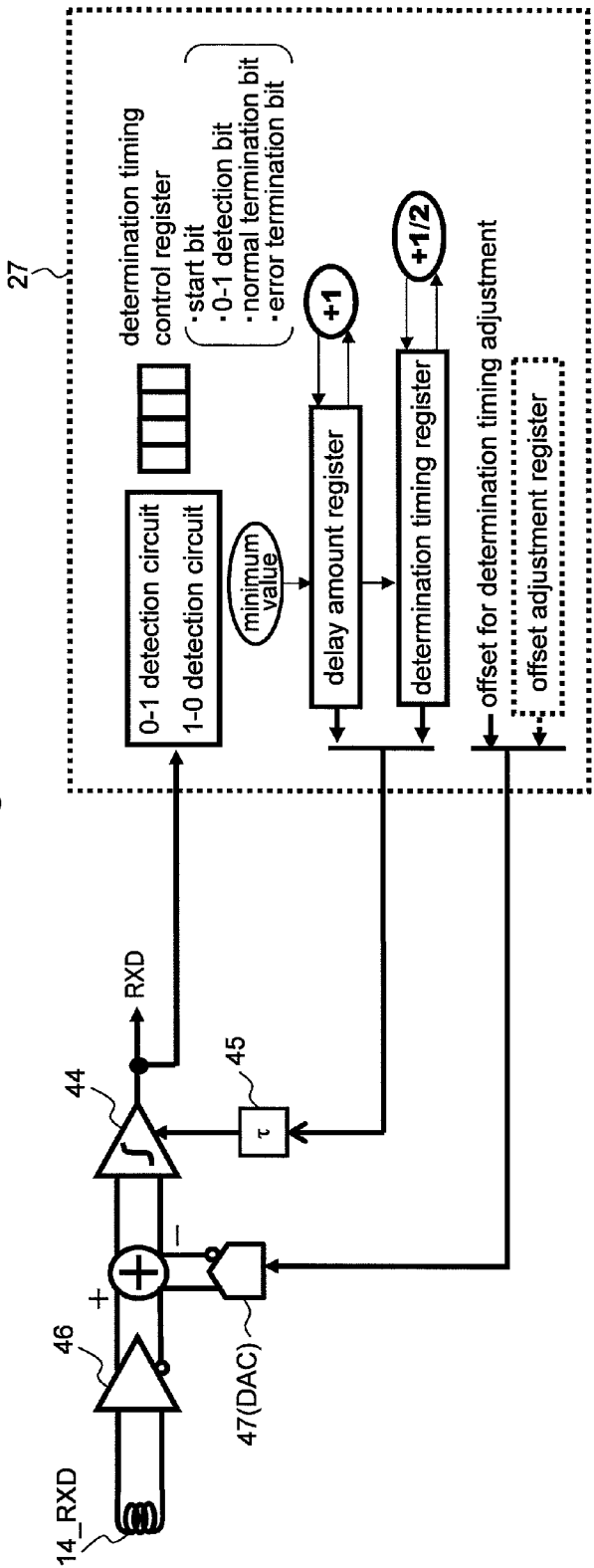
FIG. 13 is an explanatory diagram exemplarily showing an overview of an automatic offset adjustment method using an input from the comparator in FIG. 6.
Figure 14:
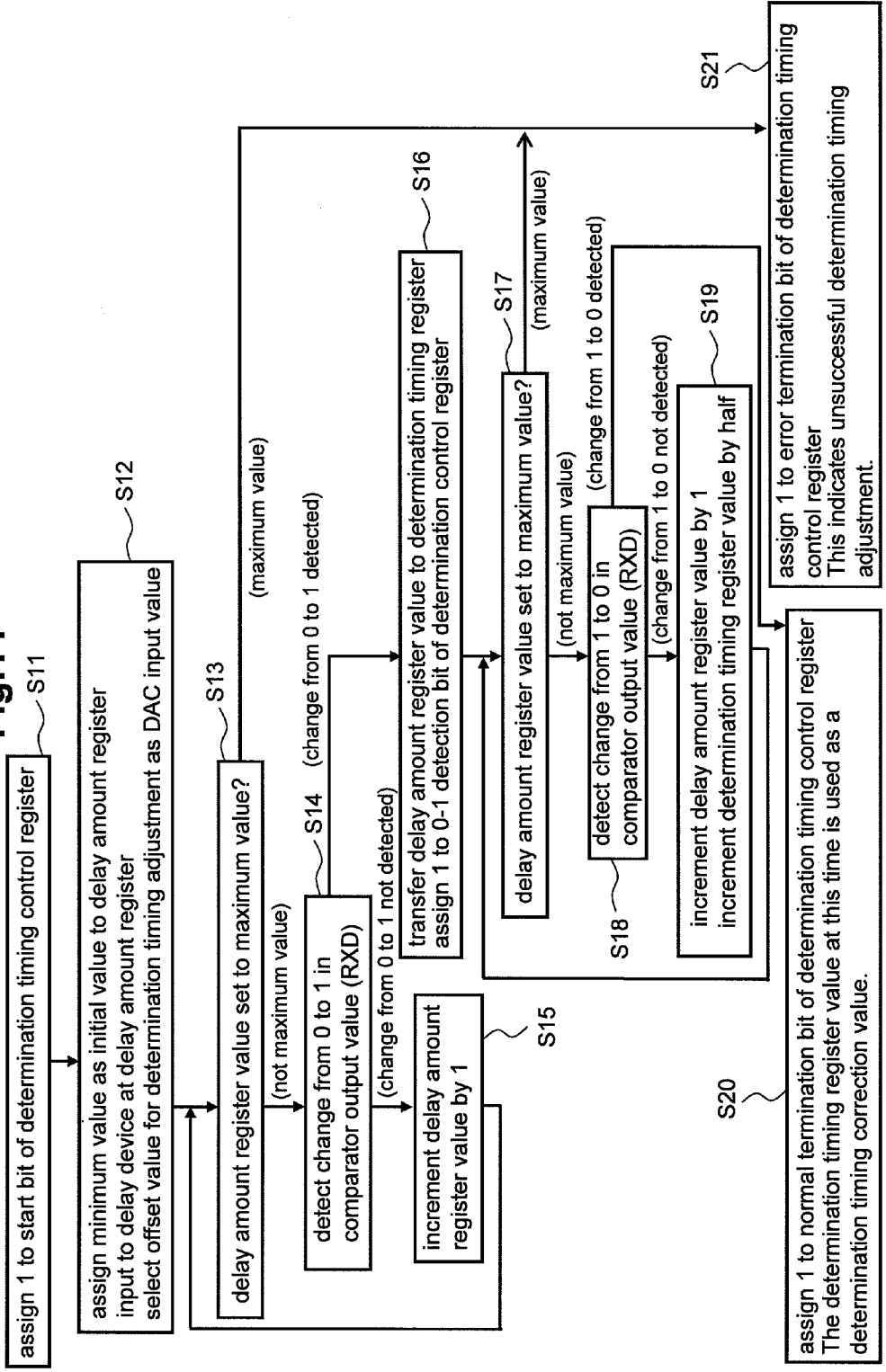
FIG. 14 is a process flow of an automatic determination timing adjustment method.
Figure 15:
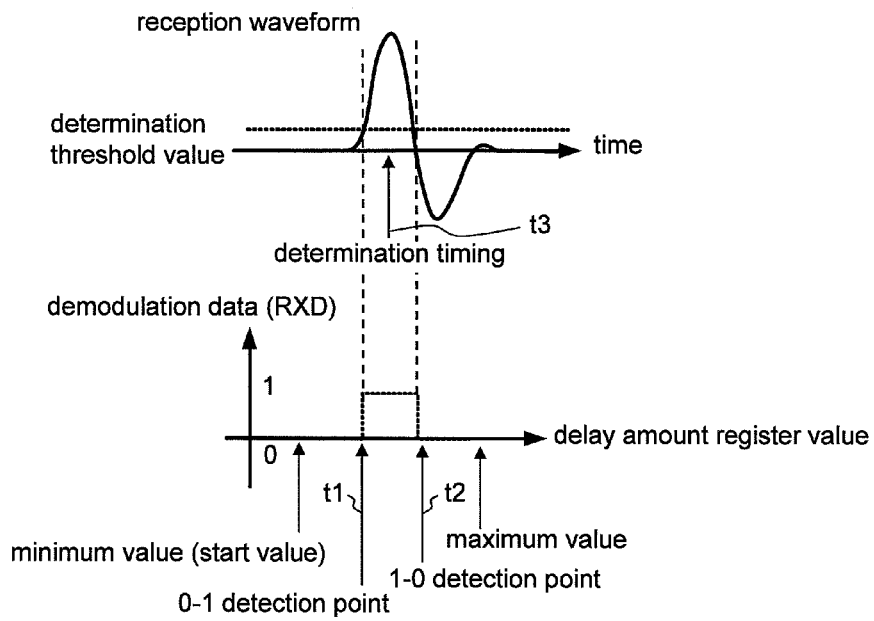
FIG. 15 is a waveform diagram showing a timing adjustment operation.

FIG. 13 exemplarily outlines an automatic determination timing adjustment method. FIG. 14 exemplarily shows a process flow of the automatic determination timing adjustment method. FIG. 15 shows a waveform of a timing adjustment operation. To adjust the determination timing for the comparator, the method sets the DAC 47 to a value (offset value for determination timing adjustment) intentionally deviated from a set offset cancel value assigned to the offset adjustment register (S11 and S12). The comparator is capable of being supplied with a large signal resulting from adding to an output from the amplifier 46 a potential difference corresponding to the offset value for determination timing adjustment. The probe then transmits data of a known data pattern such as logical value "1." In this state, the method sequentially increments a value in the delay amount register from the minimum value so that the amount of delay from the delay circuit 45 changes to gradually increase. The method sequentially detects polarities of determination values from the comparator 44 (S13 to S15). When the value in the delay amount register sequentially changes from the minimum value to the maximum value, the polarity of output RXD from the comparator 44 inverts from "0" to "1" at a given value (time t1 in FIG. 15), and the value of the delay amount register is further increased, the polarity of output RXD from the comparator 44 inverts again, returning to "0" from "1" (time t2 in FIG. 15). The value in the delay amount register at time t1 is added to a half of the increment in the delay amount register from time t1 to time t2. The resulting value is equivalent to an optimal determination timing (time t3) for the comparator 44. The determination timing register stores this value. During the communication, the method determines the pulse polarity at a timing delayed for that value in response to a change in the clock CLK. With reference to the flow chart in FIG. 14, the method detects a change from "0" to "1" in the output from the comparator 44 at S14. The method transfers the most recent value in the delay amount register to the determination timing register (S16). The method then increments the value in the delay amount register by one and determines whether or not an output from the comparator 44 changes from "1" to "0" (S17 and S18). The method adds the value in the determination timing register and a half of this value together each time the value in the delay amount register is incremented by one (S19). When the output from the comparator 44 changes from "1" to "0," the value in the determination timing register is equivalent to control data for the amount of delay used to specify the above-mentioned determination timing (S20). When the determination timing adjustment is completed successfully, the method assigns 1 to the normal termination bit of the determination timing control register (S20). When the determination timing adjustment is completed unsuccessfully, the method assigns 1 to the error termination bit of the determination timing control register (S21).

It may be preferable to adjust communication conditions in addition to the above using parameter adjustment registers in terms of output power for the clock transmission driver 41 and the data transmission driver 42, output timing for the data transmission driver 42, and an amplification gain for the data reception amplifier 46. When the communication conditions are configured automatically, it is possible to stabilize communication between the microcomputer 13 and the magnetic field coupling interface IC 7. Further, the transmission power control can be protected against unnecessary power consumption.

Figure 16:
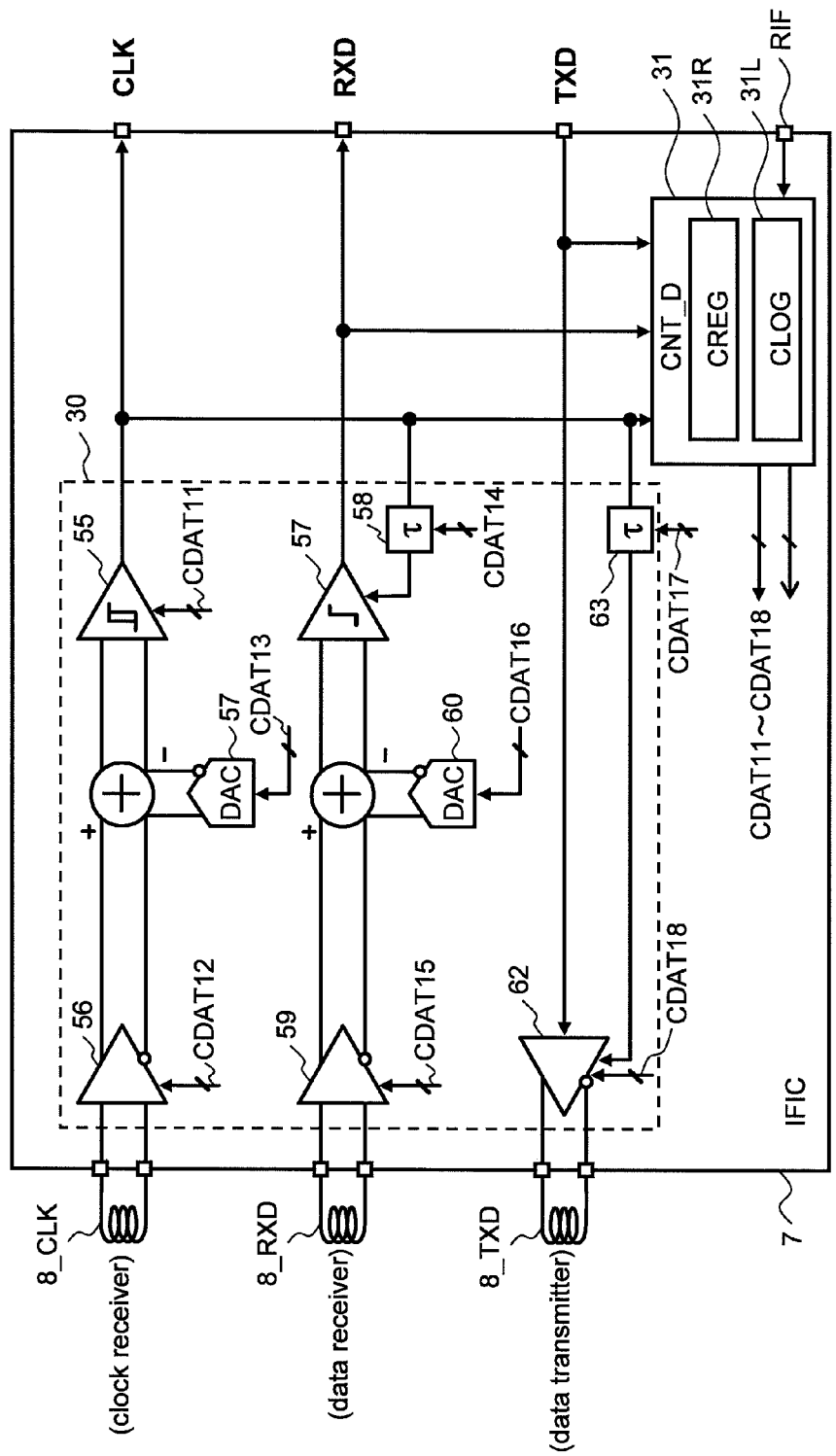
FIG. 16 is a circuit diagram showing an example of the magnetic field coupling interface.

FIG. 16 shows an example of the magnetic field coupling interface IC 7. The magnetic field coupling interface IC 7 also transmits information in accordance with the pulse transmission technique based on the magnetic field coupling as mentioned above. In this example, the coil 8 includes a clock reception coil 8_CLK, a data reception coil 8_RXD, and a data transmission coil 8_TXD.

In order for the clock transmitter to receive a clock, there is provided a hysteresis comparator 55 that detects modulation information about a reception pulse signal induced by the clock reception coil 8_CLK. In this example, the modulation information signifies the positive or negative voltage polarity of a pulse in the complementary two-phase modulation. In this example, a clock reception amplifier 56 is provided to amplify a reception signal from the clock reception coil 8_CLK. The clock reception amplifier 56 may be provided as needed in accordance with the reception signal intensity (depending on a communication distance or the like) and is omissible. A digital-analog converter circuit (DAC) 57 for offset cancellation is provided to remove a clock reception path offset. The output is added as a reverse polarity to complementary output from the data reception amplifier 56. The digital-analog converter circuit 67 is omissible when no offset needs to be removed. Control data CDAT11 is used to make variable hysteresis characteristics of the hysteresis comparator 55. Control data CDAT12 is used to make variable a gain of the data reception amplifier 56. The digital-analog converter circuit 57 converts control data CDAT13 into an analog signal.

The data receiver receives data using a comparator 57 and a delay circuit ($\tau$) 58. The comparator 57 detects modulation information about a reception pulse signal induced by the data reception coil 8_RXD. In this example, the modulation information signifies the positive or negative voltage polarity of a pulse in the complementary two-phase modulation. The delay circuit 58 allows the comparator 57 to generate an optimum detection timing based on a clock CLK recovered by the hysteresis comparator 55. There is provided a data reception amplifier 59 for amplifying a reception signal of the data reception coil 8_RXD. The data reception amplifier 59 may be provided as needed in accordance with the reception signal intensity (depending on a communication distance or the like) and is omissible. A digital-analog converter circuit (DAC) 60 for offset cancellation is provided to remove a data reception path offset. The output is added as a reverse polarity to complementary output from the data reception amplifier 59. The digital-analog converter circuit 60 is omissible when no offset needs to be removed. Control data CDAT14 is used to make variable the amount of delay for the delay circuit 58. Control data CDAT15 is used to make variable a gain of the data reception amplifier 59. The digital-analog converter circuit 60 converts control data CDAT16 into an analog signal.

The data transmitter transmits data using a data transmission driver 62 that generates a complementary pulse in accordance with transmission data supplied from the debugger 3. A delay circuit ($\tau$) 63 is provided for adjusting transmission timing of a data pulse so as to variably adjust an output timing corresponding to input to the data transmission driver 62. Control data CDAT17 is used to make the delay time adjustable. The data transmission driver 62 uses control data CDAT18 to make output power adjustable.

The control circuit 31 includes a register circuit (CREG) 31R and a logic circuit (LOG) 31L. The register circuit 31R stores parameters for controlling communication conditions on clock transmission, data transmission, and data reception using control data CDAT11 to CDAT18. The logic circuit 31L controls an operation sequence for assigning parameters to the register circuit. The logic circuit 27L has a function of detecting optimum values for various adjustment parameters. The function may be implemented by software on a host computer 1 via the debugger 3. In this example, the magnetic field coupling interface IC 7 includes the logic circuit 31L as hardware dedicated to the function.

The register circuit 31R is accessible from the debugger 3 via a register interface (RIF). The register circuit 31R includes: a clock reception gain parameter register that configures a gain adjustment value (CDAT12) for the clock reception amplifier 56; a data transmission output parameter register that configures a value (CDAT18) for adjusting data transmission output power of the driver 62; a data reception gain parameter register that configures a gain adjustment value (CDAT15) for the data reception amplifier 59; a data transmission delay parameter register that configures a delay value (CDAT17) for data transmission output timing from the delay circuit 63; an offset adjustment register that configures input values (CDAT13 and CDAT16) for the offset adjustment DACs 57 and 60; an offset adjustment control register for offset adjustment; a determination timing register that configures a determination timing correction value (CDAT14) for the delay circuit 58; a determination timing control register for determination timing adjustment; a delay amount register that configures the amount of delay amount for determination timing adjustment; and a hysteresis adjustment register that configures a hysteresis value (CDAT11) for reception amplitude adjustment.

The control circuit 31 provides control for automatic offset adjustment and automatic determination timing adjustment similarly to the microcomputer 13. In addition, the control circuit 31 provides control for measuring the intensity of signal amplitude of the recovery clock signal CLK from the hysteresis comparator 55.

Figure 19:
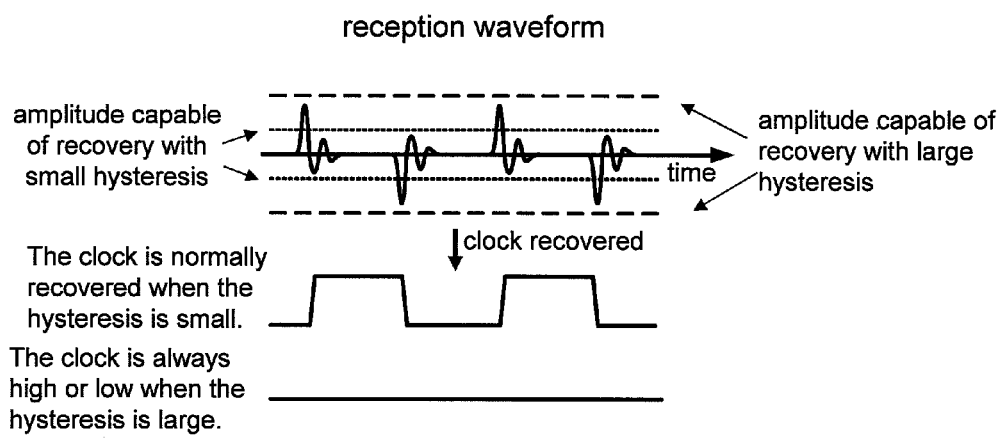
FIG. 19 is an explanatory diagram exemplarily showing relation between small and large hystereses and corresponding outputs in a hysteresis comparator.
Figure 17:
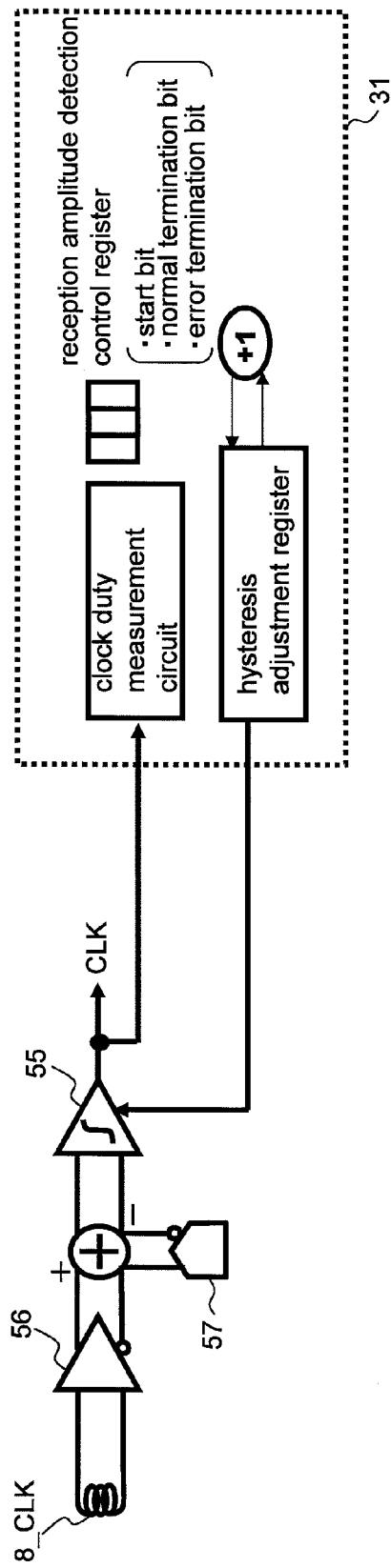
FIG. 17 is an explanatory diagram showing an overview of a signal amplitude intensity measurement method for a recovery clock signal.
Figure 18:
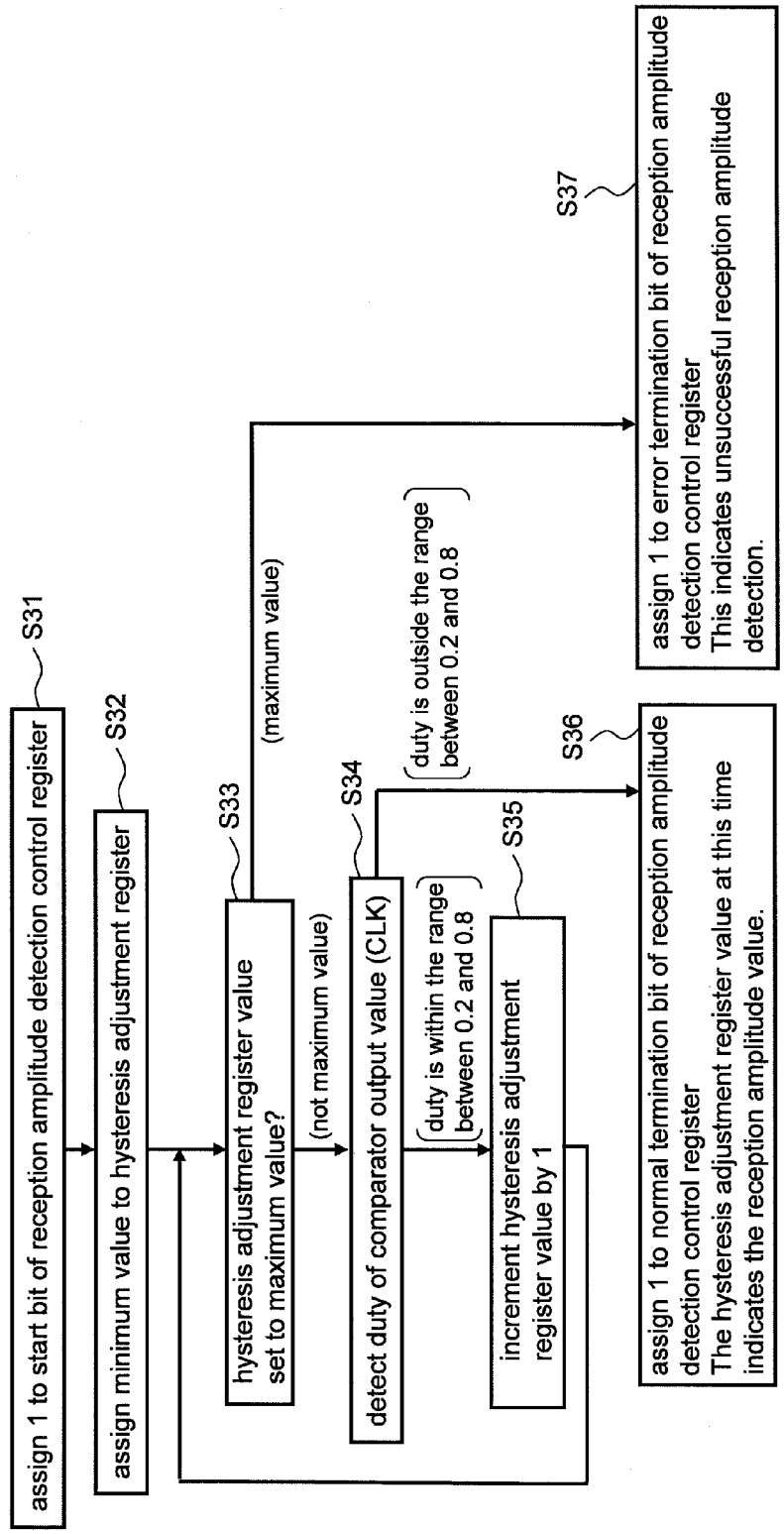
FIG. 18 is a process flow of the signal amplitude intensity measurement method.
Figure 20:
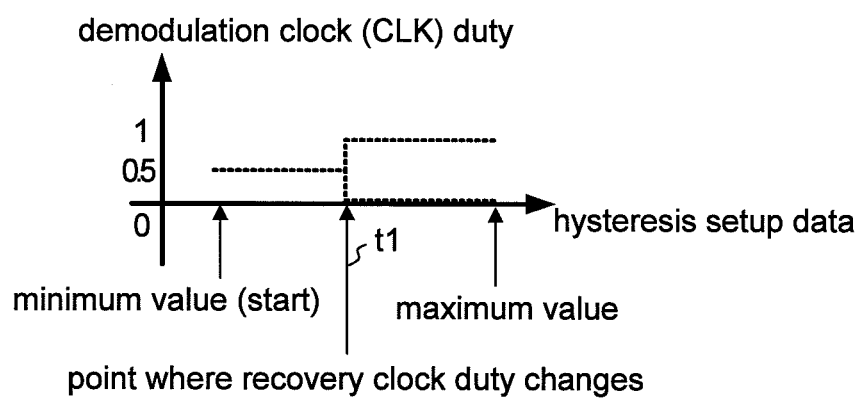
FIG. 20 is a timing chart showing a signal amplitude intensity measurement operation of the recovery clock signal.

FIG. 17 outlines a signal amplitude intensity measurement method for the recovery clock signal CLK. FIG. 18 exemplarily shows a process flow of the signal amplitude intensity measurement method for the recovery clock signal CLK. FIG. 19 exemplarily shows relation between small and large hystereses and corresponding outputs in a hysteresis comparator. FIG. 20 shows timings of a signal amplitude intensity measurement operation of the recovery clock signal CLK. When measuring the signal amplitude intensity of the recovery clock signal CLK, the method first cancels an offset for the clock reception path using DAC57 for offset cancellation. The method assigns a value to the hysteresis adjustment register to settle the hysteresis amount for the hysteresis comparator 55. When the setup value is changed so as to increase the hysteresis, a specific setup value or larger does not recover the clock as shown in FIG. 19. The output always goes high or low. As shown in FIG. 20, the amplitude intensity can be seen from the hysteresis amount at time t1 when the clock level becomes unchanged. According to the flow chart in FIG. 18, the method assigns a value to the hysteresis adjustment register and settles the hysteresis amount for the hysteresis comparator 55 (S31 and S32). The method then changes the setup value so as to increase the hysteresis. For example, the method determines whether or not an output duty from the hysteresis comparator 55 exceeds the range between 0.2 and 0.8 (S33 to S35). In this example, the duty exceeding the range between 0.2 and 0.8 is assumed to be a state in which the clock is not recovered and an output steadily goes high or low. When the duty exceeds the range between 0.2 and 0.8, the value stored in the hysteresis adjustment register is equivalent to data indicative of the reception signal amplitude to be determined (S36). When the reception signal amplitude is measured successfully, the method assigns 1 to the normal termination bit of a reception amplitude detection control register (S36). When the reception signal amplitude is measured unsuccessfully, the method assigns 1 to the error termination bit of the reception amplitude detection control register (S37). The reception signal amplitude can be adjusted likewise when the hysteresis comparator is used as a data receiver. When the reception signal amplitude is measured, the reception signal intensity may be monitored to change relative positions of the microcomputer and the magnetic field coupling interface IC. In this case, a position for maximizing the reception signal intensity denotes the position where the coil of the microcomputer faces against the coil of the magnetic field coupling interface IC with the shortest distance therebetween. This technique can be used to position a coil for the probe and a coil for the microcomputer. In addition, a lower-power operation is possible while the reception signal power is detected to configure the required minimum transmission power.

FIG. 21 exemplarily shows a communication path establishment procedure at the system startup. It is necessary to establish a wireless communication path for debugging at the system startup. It is desirable to configure the communication condition by specifying parameters for offset adjustment and determination timing of the reception function. Adjustment procedures at the system startup are broadly classified into: reset; initializing the transmitter; automatically correcting a receiver offset; transmitting a clock and adjusting the probe position; adjusting the determination timing to receive data at the magnetic field coupling interface IC; adjusting the determination timing to receive data at the microcomputer; and notifying the initialization completion.

The reset process resets both the magnetic field coupling interface IC 7 and the microcomputer 13 (SM1 and SD1). To reset the microcomputer 13, the mode terminal MDi is used to specify the debug mode. For example, a power-on reset sequence may be used to reset the microcomputer. Alternatively, an asynchronous channel may be independently mounted for communication from the probe 3 to the microcomputer 13. Accordingly, the probe 5 can reset the microcomputer 13 using the asynchronous channel to supply the microcomputer 13 with a specific pattern.

The transmitter initialization concerns the clock transmitter and the data transmitter of the microcomputer and the data transmitter of the magnetic field coupling interface IC 7. The reset process initializes values of a determination timing register, a transmission power adjustment register, and a transmission delay adjustment register for the transmitters to predetermined values (SM2 and SD2).

The transmitter initialization also concerns the data transmitter of the microcomputer and the clock receiver and the data transmitter of the magnetic field coupling interface IC 7. After the reset, an offset of each receiver is automatically corrected (SM3 and SD3).

As the clock transmission and the probe position adjustment, the process allows the microcomputer to continue transmitting the clock to the probe 5 after termination of the automatic offset correction for the receiver (SM4). After termination of the automatic offset correction for the clock receiver, the process allows the probe to detect reception amplitude (SD4). The process adjusts the probe position so as to increase the reception amplitude. When no clock reception is detected within a specified time during the reception amplitude detection, the process allows the host computer to display an error as unsuccessful communication and then terminates (SD5 and SD12).

The process adjusts the data reception determination timing for the magnetic field coupling interface IC 7 as follows.

The process allows the microcomputer 13 to continue transmitting "data pattern 1" to the probe 5 after completion of the automatic offset correction for the receiver (SM5). After termination of the clock transmission and the probe position adjustment, the process allows the magnetic field coupling interface IC 7 to adjust the determination timing for the data receiver (SD6). When "data pattern 1" is not received within a specified time, the process allows the host computer 13 to display an error as unsuccessful communication and then terminates (SD7 and SD12).

The process adjusts the data reception determination timing for the microcomputer 13 as follows. After terminating adjustment of the data reception determination timing for the magnetic field coupling interface IC 7, the process allows the probe 5 to continue transmitting "data pattern 1" to the microcomputer 13 (SD8). The process allows the microcomputer 13 to adjust the determination timing for the data receiver (SM6). When "data pattern 1" is not received within a specified time, the process indicates unsuccessful communication by enabling normal microcomputer operation mode such as the real mode, not the debug mode (SM10).

When the data reception determination timing is successfully adjusted for the microcomputer 13, the process allows the microcomputer 13 to notify the initialization completion by transmitting an initialization completion command to the magnetic field coupling interface IC 7 and starts an operation in the debug mode (SM9). The process allows the magnetic field coupling interface IC 7 to receive the initialization completion command from the microcomputer 13, recognizes the initialization completion (SD9), and starts the debugging control (SD11). When the initialization completion command is not received within a specified period (SD10), the debugger software allows the host computer 1 to indicate unsuccessful communication and then terminates (SD12).

Figure 22:
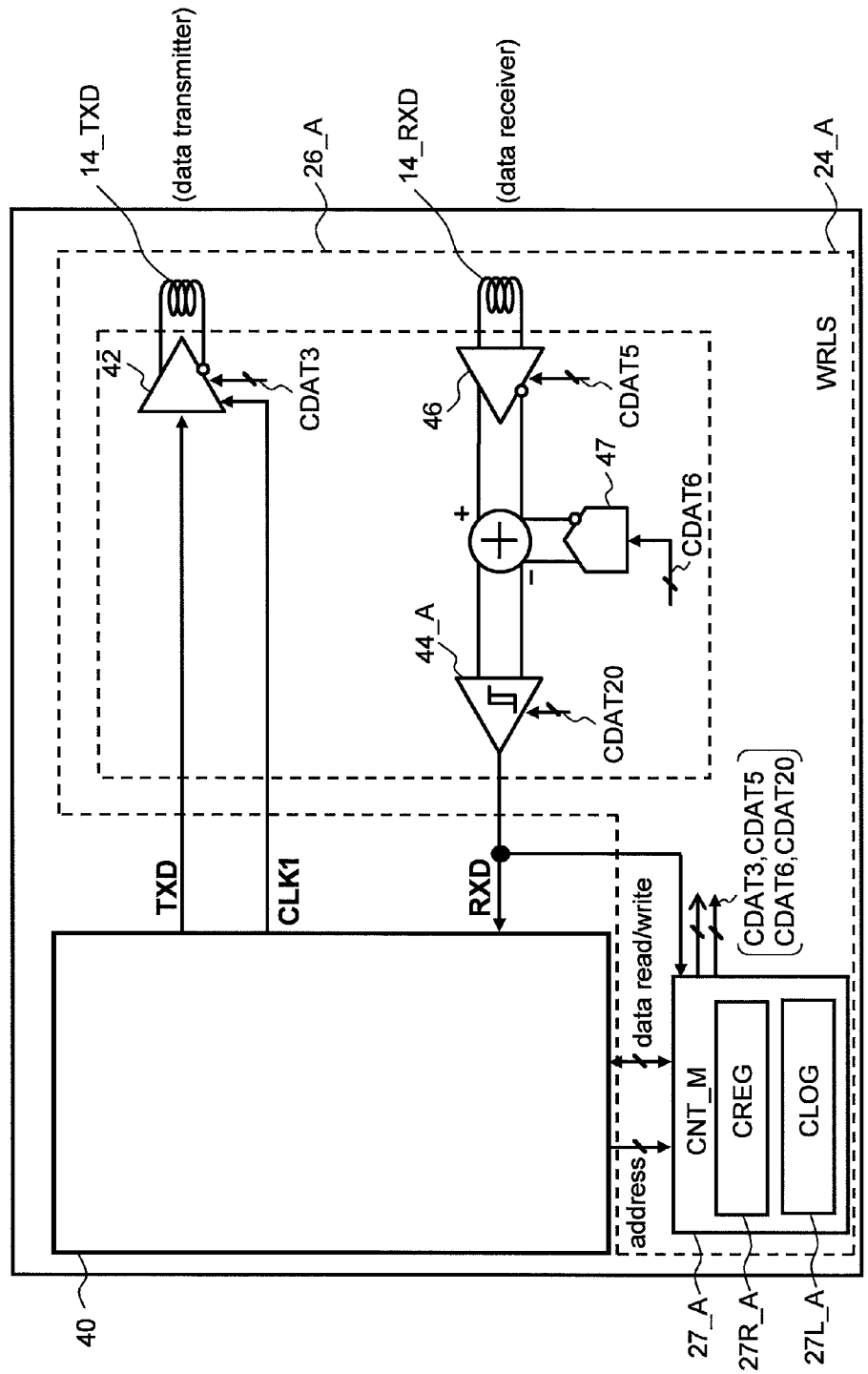
FIG. 22 is a circuit diagram showing another example of the wireless-communications interface circuit included in the microcomputer.

FIG. 22 shows another example of the wireless-communications interface circuit included in the microcomputer 13. A wireless-communications interface circuit 24_A in FIG. 22 is used for asynchronous communication. When a requested data rate is not so high, the asynchronous communication can be used for data transmission and reception. This makes it possible to eliminate the need for adjusting the transceiver timing and greatly simplify the system. As differences from FIG. 6, no clock transmitter is used, a data transmitter and a data receiver are used, the variable delay circuits 43 and 45 are not used, and a hysteresis comparator is used for the data receiver. As mentioned above, the wireless-communications interface circuit 24_A transmits information in accordance with the pulse transmission technique based on the magnetic field coupling.

To transmit data, there are provided the data transmission driver 42 and the data transmission coil 14_TXD for generating a complementary pulse in accordance with transmission data output from the debugging support circuit 17. Control data CDAT3 makes output power for the data transmission driver 42 adjustable. A transmission operation synchronizes with internal clock CLK1. The internal clock CLK1 is not targeted for synchronous communication.

To receive data, there are provided the data reception coil 14_RXD and a hysteresis comparator 44_A that detects modulation information about a reception pulse signal induced by the data reception coil 14_RXD. In this example, the modulation information signifies the positive or negative voltage polarity of a pulse in the complementary two-phase modulation. There is also provided the data reception amplifier 46 for amplifying a reception signal of the data reception coil 14_RXD. The data reception amplifier 46 may be provided as needed in accordance with the reception signal intensity (depending on a communication distance or the like) and is omissible. The digital-analog converter circuit (DAC) 47 for offset cancellation is provided to remove a data reception path offset. The output is added as a reverse polarity to complementary output from the data reception amplifier 46. The digital-analog converter circuit 47 is omissible when no offset needs to be removed. Control data CDAT3 is used to make variable the power for the data transmission driver 42. Control data CDAT5 is used to make variable a gain of the data reception amplifier 46. Control data CDAT20 is used to make variable hysteresis characteristics of the hysteresis comparator 44_A. The digital-analog converter circuit 47 converts control data CDAT6 into an analog signal.

The control circuit 27_A includes a register circuit (CREG) 27R_A and a logic circuit (LOG) 27L_A. The register circuit (CREG) 27R_A stores parameters, that control communication conditions for data transmission and reception using control data CDAT3, CDAT5, CDAT6, and CDAT20. The logic circuit (LOG) 27L_A controls an operation sequence for assigning parameters to the register circuit. The logic circuit 27L_A has a function of detecting optimum values for various adjustment parameters. The function may be implemented by software on the host computer via the debugger. In this example, the wireless-communications interface circuit 24_A includes the logic circuit 27L_A as hardware dedicated to the function.

The register circuit 27R_A is accessible from the debugger 3 via a CPU 18 or a debugging support circuit 17. The register circuit 27R_A includes: a data transmission output parameter register that configures an adjustment value (CDAT3) for data transmission output power; a data reception gain parameter register that configures a gain adjustment value (CDAT5) for the data reception amplifier; an offset adjustment register that configures a DAC input value (CDAT6) for offset adjustment; an offset adjustment control register for offset adjustment; and a hysteresis adjustment register that configures a hysteresis value (CDAT20) for reception amplitude adjustment.

The methods of automatically adjusting the data receiver offset and adjusting the reception signal amplitude are the same as the above-mentioned and a detailed description is omitted for simplicity.

Figure 23:
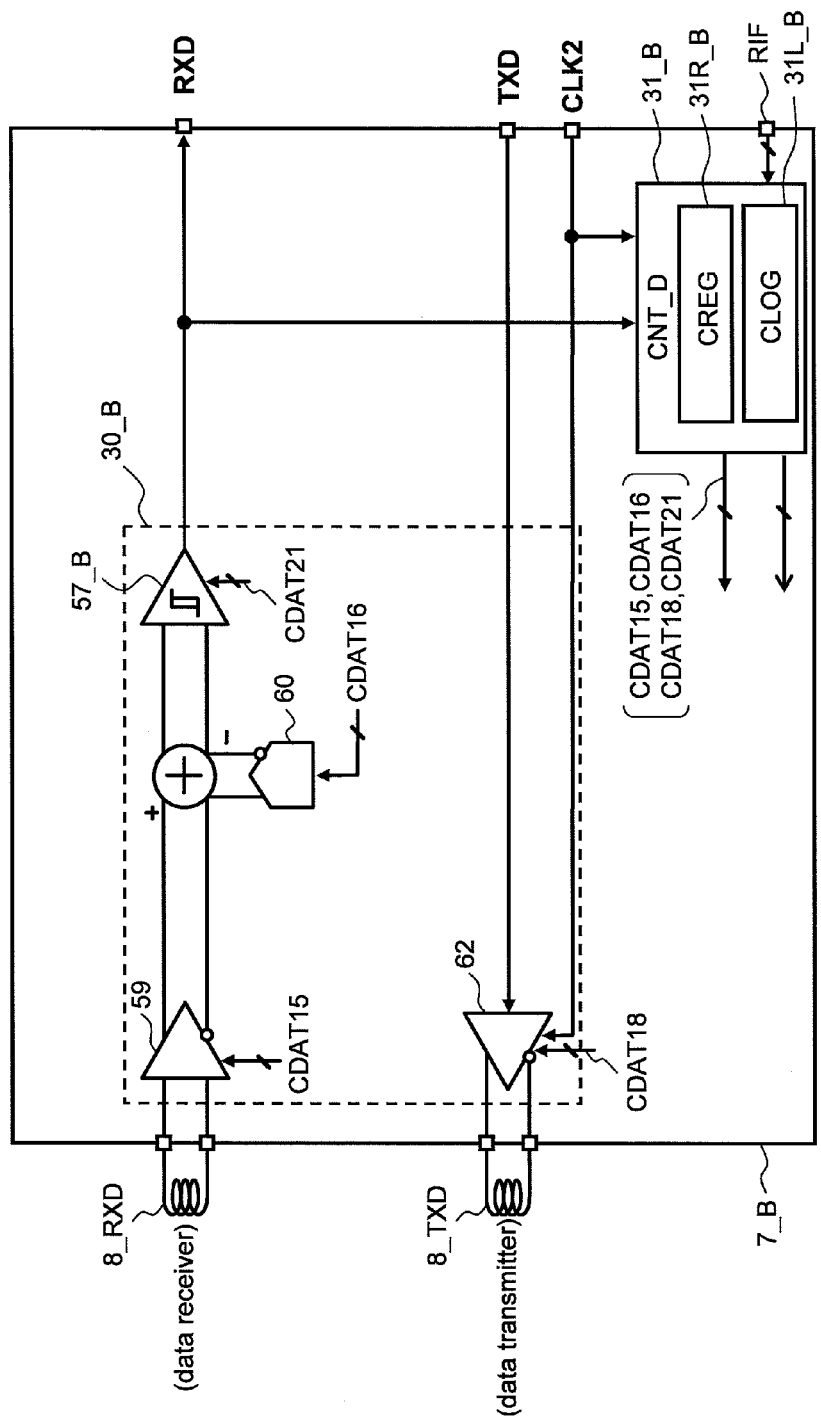
FIG. 23 is a circuit diagram showing another example of the magnetic field coupling interface IC.

FIG. 23 shows another example of the magnetic field coupling interface IC. A magnetic field coupling interface IC 7_B in FIG. 23 is used for asynchronous communication. As differences from FIG. 16, no clock receiver is provided, a data transmitter and a data receiver are provided, the variable delay circuits 58 and 63 are not used, and a hysteresis comparator 57_B is used for the data receiver. As mentioned above, the magnetic field coupling interface IC 7_B transmits information in accordance with the pulse transmission technique based on the magnetic field coupling.

To receive data, there is provided the hysteresis comparator 57_B that detects modulation information about a reception pulse signal induced by the data reception coil 8_RXD. In this example, the modulation information signifies the positive or negative voltage polarity of a pulse in the complementary two-phase modulation. There is also provided the data reception amplifier 59 for amplifying a reception signal of the data reception coil 8_RXD. The digital-analog converter circuit (DAC) 60 for offset cancellation is provided to remove a data reception path offset. The output is added as a reverse polarity to complementary output from the data reception amplifier 59. Control data CDAT15 is used to make variable a gain of the data reception amplifier 59. The digital-analog converter circuit 60 converts control data CDAT16 into an analog signal. Control data CDAT21 is used to make variable hysteresis characteristics of the hysteresis comparator 57_B.

To transmit data, there is provided the data transmission driver 62 that generates a complementary pulse in accordance with transmission data TXD supplied from the debugger 3 and drives the data transmission coil 8_TXD. Control data CDAT18 makes output power for the data transmission driver 62 adjustable. A transmission operation of the transmission driver 62 synchronizes with internal clock CLK2.

The control circuit 31_B includes a register circuit (CREG) 31R_B and a logic circuit (LOG) 31L_B. The register circuit (CREG) 31R_B stores parameters, that control communication conditions for data transmission and reception using control data CDAT15, CDAT16, CDAT18, and CDAT21. The logic circuit (LOG) 31L_B controls an operation sequence for assigning parameters to the register circuit. The logic circuit 31L_B has a function of detecting optimum values for various adjustment parameters.

The register circuit 31R_B is accessible from the debugger 3 via the register interface (RIF). The register circuit 31R includes: a data transmission output parameter register that configures an adjustment value (CDAT18) for data transmission output power; a data reception gain parameter register that configures a gain adjustment value (CDAT15) for the data reception amplifier 59; an offset adjustment register that configures an input value (CDAT16) for offset adjustment; an offset adjustment control register for offset adjustment; and a hysteresis adjustment register that configures a hysteresis value (CDAT21) for reception amplitude adjustment. The control circuit 31_B provides control for automatically adjusting an offset and measuring intensity of the signal amplitude by the hysteresis comparator 57_B.

Figure 24:
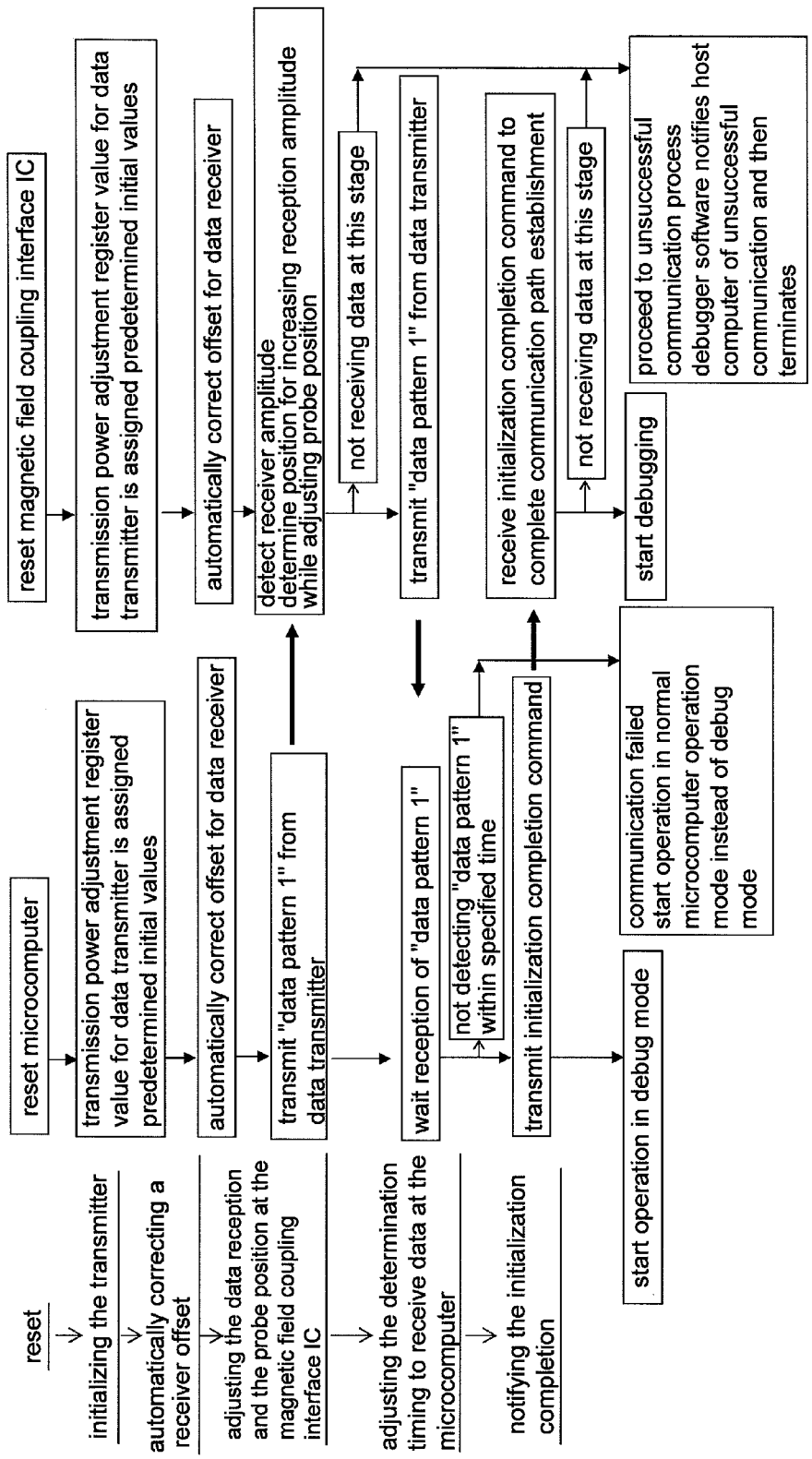
FIG. 24 is a flow chart exemplarily showing various processes at initiation of the system using asynchronous communication between the wireless-communications interface circuit in FIG. 22 and the magnetic field coupling interface in FIG. 23.

FIG. 24 exemplarily shows various processes at initiation of the system using asynchronous communication between the wireless-communications interface circuit in FIG. 22 and the magnetic field coupling interface 7_B in FIG. 23. A difference from the processes in FIG. 21 is elimination of the process concerning the clock transmission adjustment. The other processes are substantially the same as those described with reference to FIG. 21 and a detailed description is omitted for simplicity.

FIGS. 25 through 31 exemplarily show variations of package types and coil arrangements in a microcomputer.

Figure 25:
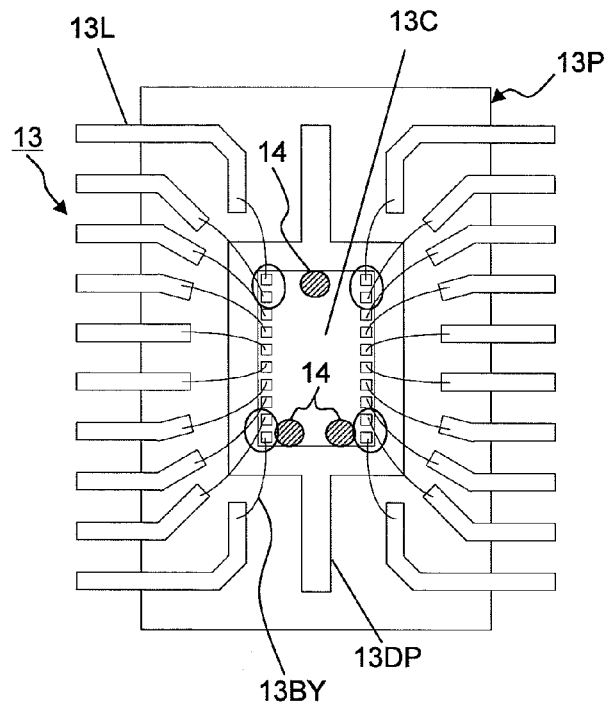
FIG. 25 is a plan view showing a first example of coil arrangement when package types SOP, SSOP, and DIP are used.
Figure 26:
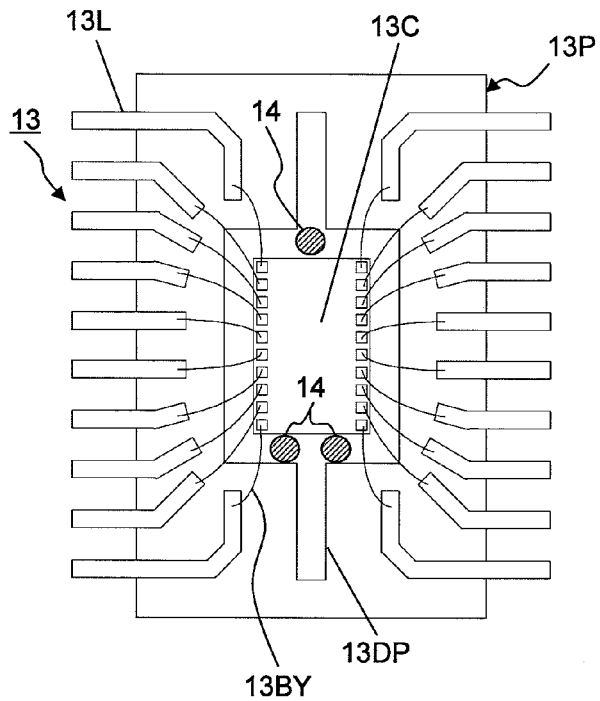
FIG. 26 is a plan view showing a second example of coil arrangement when package types SOP, SSOP, and DIP are used.

FIGS. 25 and 26 exemplarily show coil arrangements for package types SOP (Small Outline Package), SSOP (Shrink Small Outline Package), and DIP (Dual Inline Package). When the coil 14 is fabricated over the semiconductor integrated circuit chip as shown in FIG. 25, the coil 14 may be fabricated over the surface of an unused wiring layer or top layer of the semiconductor integrated circuit chip 13C. It is necessary to prevent a coil signal and a lead signal from interfering with each other when a bonding wire 13BY and the coil 14 cross or approach to each other. For example, the coil 14 is placed near an edge that does not include the lead 13L. The lead 13L near four corners of the package 13P is used for a power supply, ground, or mode terminal, not for a frequently varying signal. The coil 14 may or may not be formed over the semiconductor integrated circuit chip 13C. The microcomputer 13 may be formed inside the package 13P and outside the semiconductor integrated circuit chip 13C. For example, part of a die pad 13DP is used to form a coil pattern as the coil 14 electrically insulated from a metal pattern of a die pad DP. As shown in FIG. 26, arranging the coil 14 over the die pad makes it possible to eliminate coil position variations depending on devices. In addition, a coil coordinate position can be easily fixed with reference to the package outside.

Figure 27:
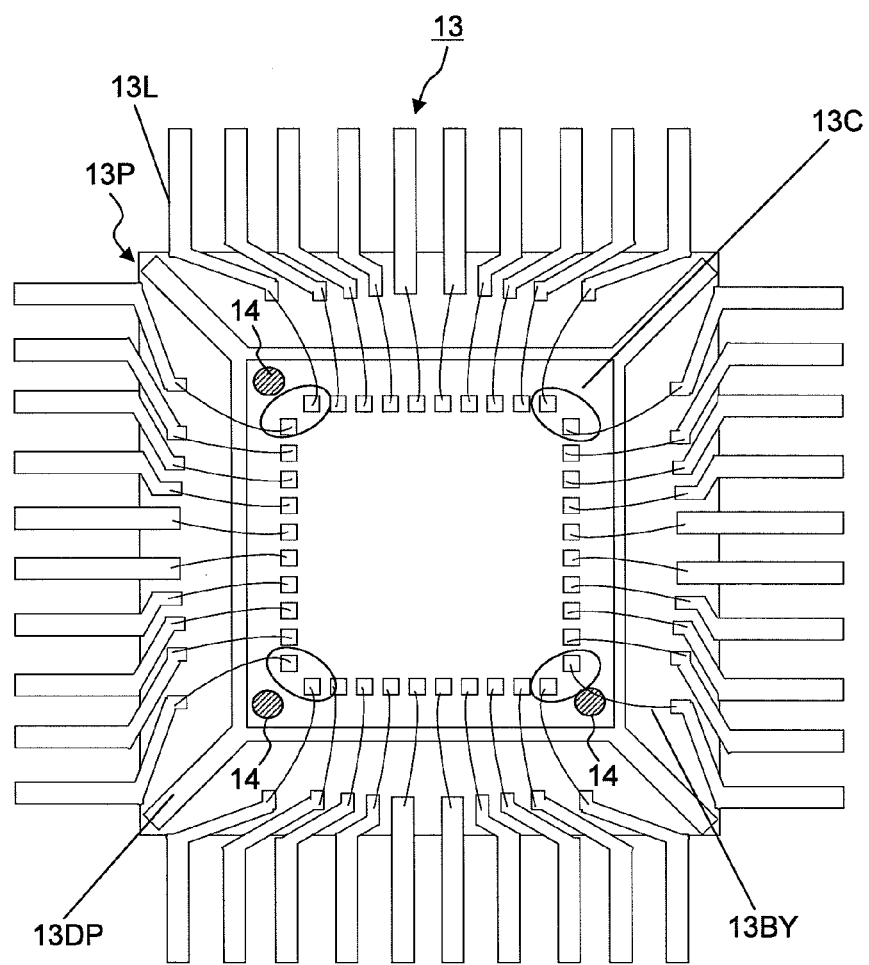
FIG. 27 is a plan view showing a first example of coil arrangement when package types QFP and QFN are used.
Figure 28:
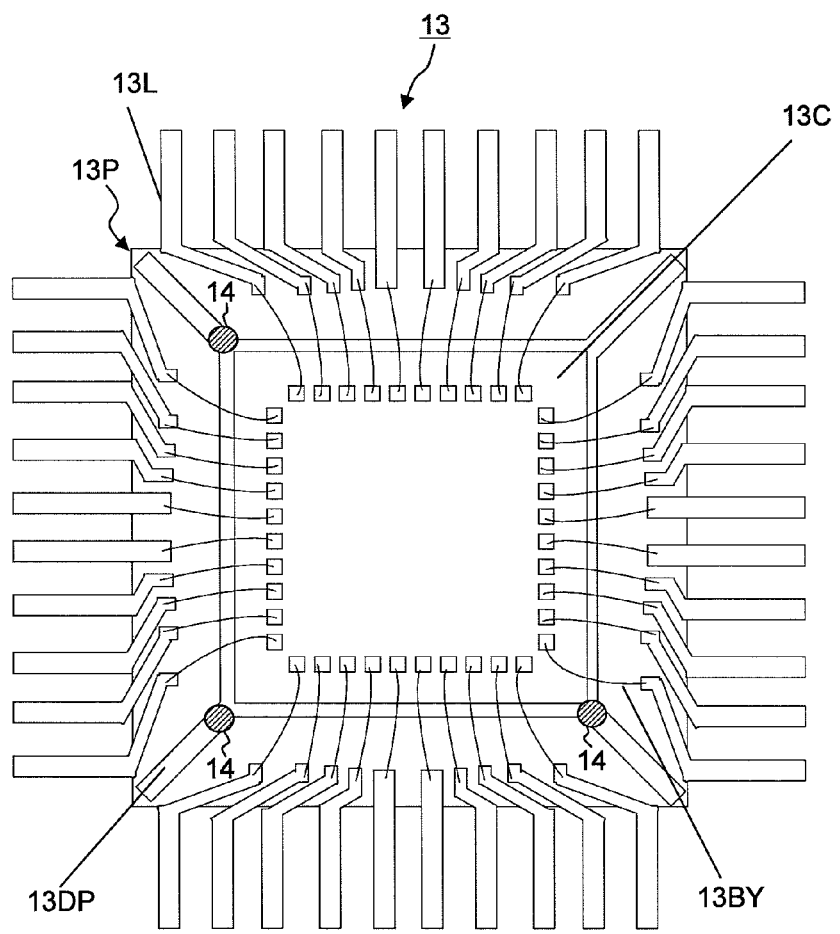
FIG. 28 is a plan view showing a second example of coil arrangement when package types QFP and QFN are used.
Figure 29:
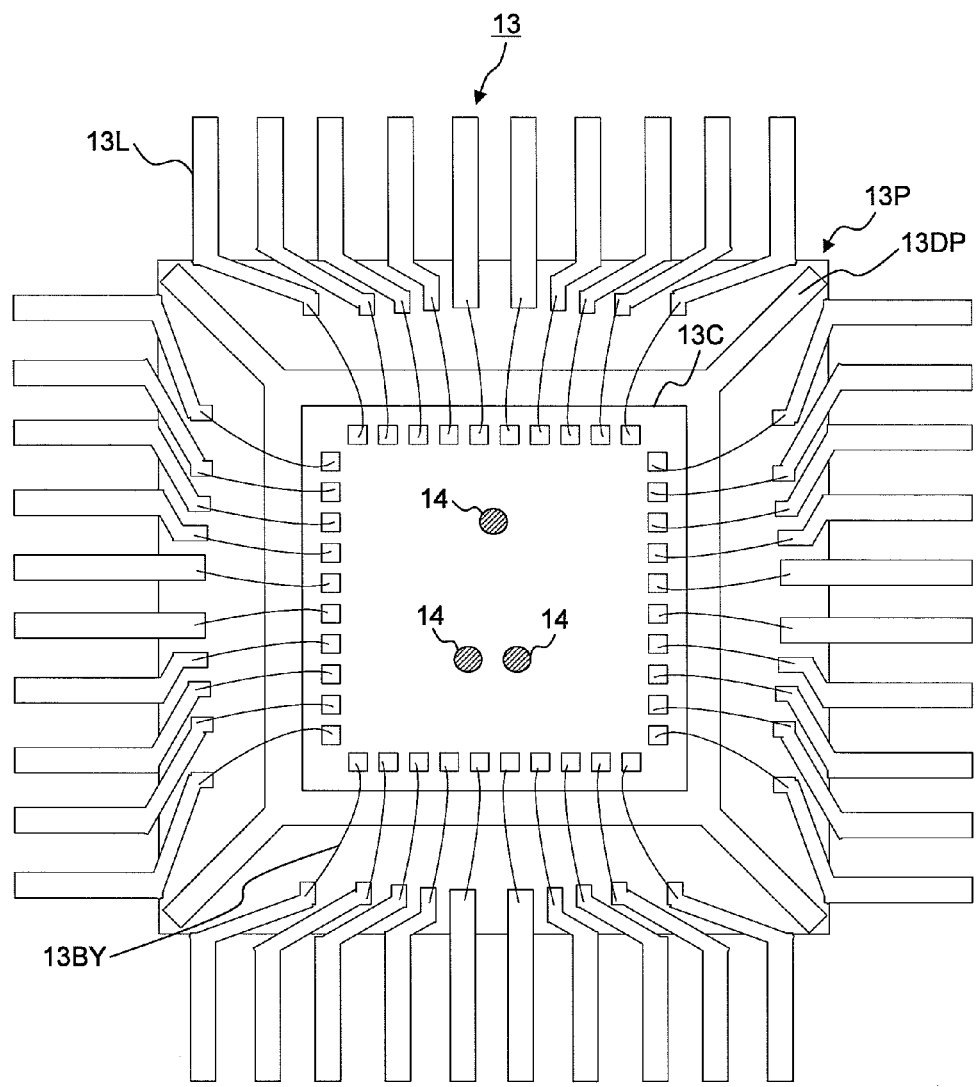
FIG. 29 is a plan view showing a third example of coil arrangement when package types QFP and QFN are used.

FIGS. 27 through 29 exemplarily show coil arrangements for package types QFP (Quad Flat Package) and QFN (Quad Flat Non_leaded package). As shown in FIG. 27, the coil 14 is fabricated over the semiconductor integrated circuit chip 13C. In this case, it is necessary to prevent a coil signal and a lead signal from interfering with each other when the bonding wire 13BY and the coil 14 cross or approach to each other. For example, the coil 14 is placed at four corners of the semiconductor integrated circuit chip 4, and the lead 13L near four corners of the package 13P is not used for a frequently varying signal. As shown in FIG. 28, arranging the coil 14 over the die pad 13DP makes it possible to eliminate coil position variations depending on devices. In addition, a coil coordinate position can be easily fixed with reference to the outside of the package 13P. For a large-size chip as shown in FIG. 29, it is necessary to prevent a coil signal and a lead signal from interfering with each other when the bonding wire 13BY and the coil 14 cross or approach to each other. For example, the coil 14 is placed near the center of the semiconductor integrated circuit chip 13C, and the lead 13L near the coil 14 is not used for a frequently varying signal.

Figure 30:
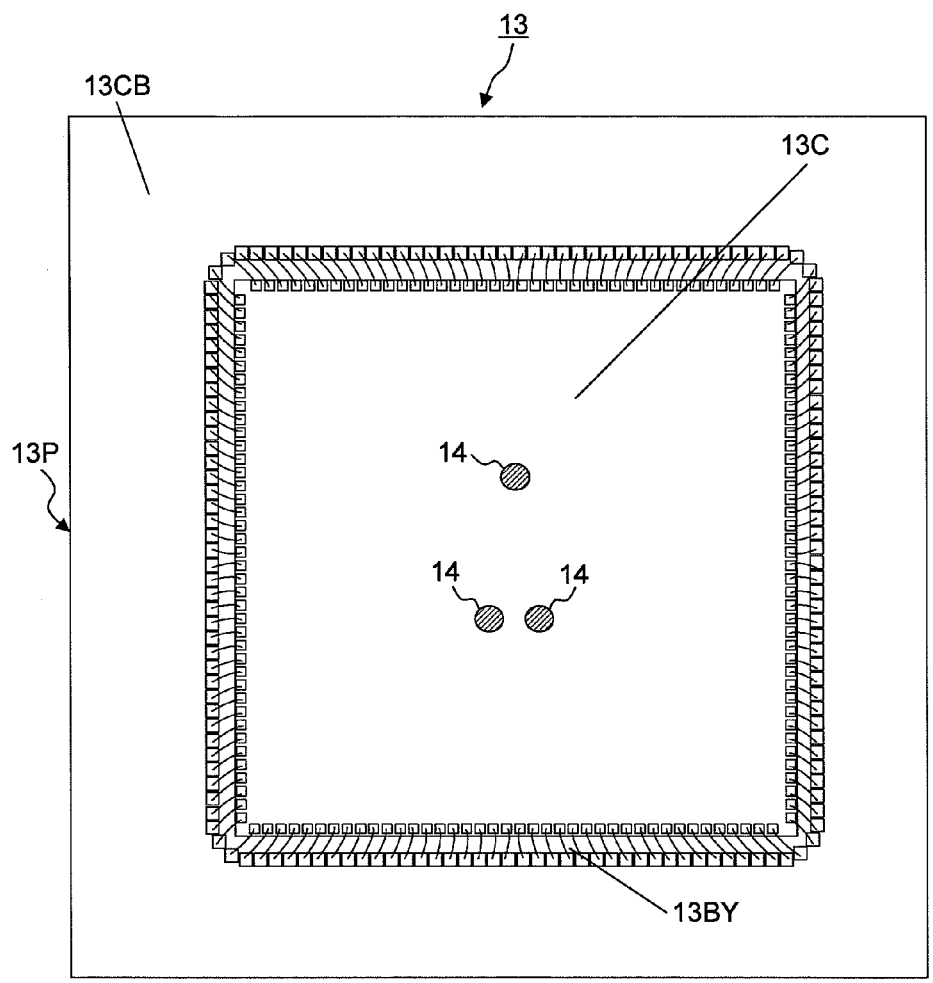
FIG. 30 is a plan view showing an example of coil arrangement when package type BGA is used.

FIG. 30 exemplarily shows a coil arrangement for package type BGA (Ball Grid Array). The same consideration as in FIG. 29 just needs to be given when the coil 14 is formed over the semiconductor integrated circuit chip 13. The coil 14 may be formed over a substrate 13CB having a reverse side provided with a solder bump terminal, not over the semiconductor integrated circuit chip 13C. Arranging the coil 14 over the die pad 13CB makes it possible to eliminate coil position variations depending on devices. In addition, a coil coordinate position can be easily fixed with reference to the outside of the package 13P.

Figure 31:
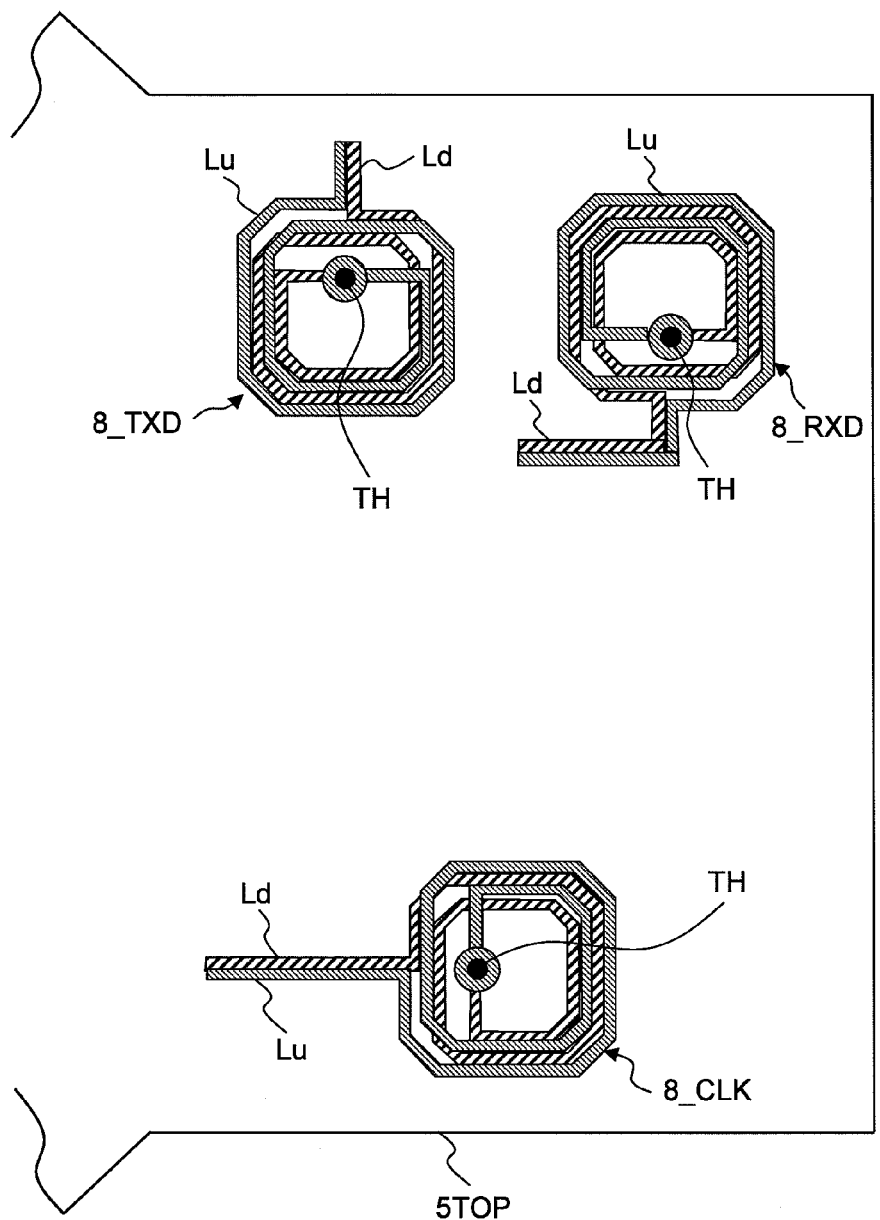
FIG. 31 is a plan view exemplarily showing a specific pattern of the coil at the tip of the probe in FIG. 3.

FIG. 31 exemplarily shows a specific pattern of the coils 14 at the tip 5TOP in FIG. 3. Coils 8_CLK, 8_TXD, and 8_RXD are formed as double coils over both sides of the probe. Reference symbol Lu denotes a winding formed over an upper surface of the probe. Reference symbol Ld denotes a winding formed over a lower surface of the probe. Both are coupled by a through-hole TH.

Figure 32:
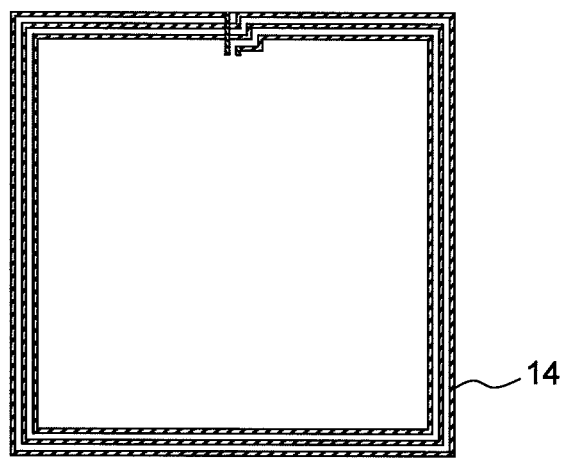
FIG. 32 is a plan view exemplarily showing a specific pattern of the coil provided for the microcomputer.

FIG. 32 exemplarily shows a pattern of the coil 14 for the microcomputer 13. The use of a double wiring layer eliminates short-circuiting at a crossing portion.

The coil pattern in FIG. 32 corresponds to one of the oils in FIG. 31 for the probe. For example, let us suppose that one side of the coil 8 for the probe 5 equals one millimeter long, then, one side of the coil 14 for the microcomputer equals 0.6 millimeters long.

The system debugging technology using the wireless communication in accordance with the above-mentioned pulse transmission technique provides the following effects.

The wireless-communications interfaces the debugger with the microcomputer. It is possible to eliminate an external terminal for debugging from the microcomputer and increase the number of terminals used by users for the system debugging.

The wireless communication uses the pulse transmission technique based on the magnetic field coupling. Accordingly, a small-sized antenna can be configured over a chip. The transceiver circuit can be small-sized. Low-power consumption can be achieved. Relatively high security is available because the communication requires proximity. Communication rates can be configured freely. In many cases, the microcomputer uses the clock signal inside the microcomputer in an unchanged or divided form for external communication operations or trace output operations. Clock frequencies depend on microcomputer types or users. Under these conditions, communication rates can be configured freely in accordance with an operating clock frequency of the microcomputer. The wireless-communications interface circuit 24 can ensure enhanced versatility. The wireless-communications interface circuit 24 can be applied to various microcomputers as the design property referred to as an IP module.

Since the microcomputer changes the clock frequency during operation, the debugging interface frequency can be easily changed in accordance with the clock frequency. This improves the usability of the debugging interface function as a debugging control mechanism of the microcomputer.

The probe can be detachably fixed to the surface of the microcomputer package using a double-sided tape, adhesive tape, or adhesive material only during a period for using the debugger. An expensive connector or the like is unnecessary. The detachable coupling is available affordably and easily.

A conventional debugger is available through the use of the probe. There is no need to purchase or prepare a new hardware debugger.

While there have been described specific preferred embodiments of the present invention, it is to be distinctly understood that the present invention is not limited thereto but may be otherwise variously embodied within the spirit and scope of the invention.

For example, multiple bits may be used for data transmission and reception. A common coil may be used for transmission and reception. The invention is applicable otherwise than the system debugging. For example, the wireless communication according to the pulse transmission technique may be applied to interface a microcomputer having an electrically rewritable nonvolatile memory chip with a writing device such as an EPROM writer. The wireless communication is applicable to the other wireless-communications interfaces.

INDUSTRIAL APPLICABILITY

The present invention is applicable to an interface technology using magnetic field coupling of a coil. In particular, the invention is widely applicable to a close coupling and contactless interface technology, a system debugging that evaluates a target system using a debugger, and the like.

What is claimed is:

1. A system debugging method for a debugger to control a microcomputer having a debugging support circuit for supporting a system debugging, comprising the following steps:
when wireless communication is performed between the microcomputer and the debugger in accordance with a pulse transmission technique based on magnetic field coupling by oppositely placing a first coil arrangement included in the microcomputer and a second coil arrangement coupled to the debugger;
operating the microcomputer to perform a process of configuring a communication condition of the wireless communication during an initialization operation;
operating the microcomputer to await control from the debugger via the debugging support circuit when the microcomputer establishes communication with the debugger; and
operating the debugger to await establishment of the communication and to proceed with control of the microcomputer in accordance with the wireless communication,
wherein the debugger performs wireless communication with the microcomputer via a magnetic field coupling interface IC having a second transceiver circuit and a second control circuit, the second transceiver circuit being coupled with the second coil arrangement at one side and with the debugger at another side, and the second control circuit is coupled with the debugger and provides the second transceiver circuit with a communication condition based on magnetic field coupling, and
wherein the microcomputer performs wireless communication with the debugger through operations of a first transceiver circuit and a first control circuit, the first transceiver circuit being coupled with the first coil arrangement, and the first control circuit providing the first transceiver circuit with a communication condition based on magnetic field coupling.

2. The system debugging method according to claim 1, wherein the first coil arrangement includes at least one first coil formed over a conductive layer of a semiconductor integrated circuit chip included in the microcomputer.

3. The system debugging method according to claim 2, wherein the first coil arrangement includes at least one first coil placed at a corner of the semiconductor integrated circuit chip.

4. The system debugging method according to claim 1, wherein the first coil arrangement includes at least one first coil formed inside a package and outside a semiconductor integrated circuit chip.

5. The system debugging method according to claim 1, wherein the second coil arrangement includes at least one second coil formed over an interfacing flexible substrate where the magnetic field coupling interface IC is mounted and an interface wiring is provided for coupling the mounted magnetic field coupling interface IC with the debugger.

6. The system debugging method according to claim 1, wherein the second coil arrangement includes at least one second coil formed over a conductive layer of a semiconductor integrated circuit chip for forming the magnetic field coupling interface IC.

7. The system debugging method according to claim 1, wherein the first coil arrangement includes first coil independently functioning as a transmission coil, and the second coil arrangement includes second coils independently functioning as a transmission coil and a reception coil.

8. The system debugging method according to claim 7, wherein the first coil arrangement includes first coils independently used for clock transmission, data transmission, and data reception, and the second coil arrangement includes second coils independently used for clock reception, data transmission, and data reception.

9. The system debugging method according to claim 7, wherein the first coil arrangement includes first coils independently used for data transmission and data reception, and the second coil arrangement includes second coils independently used for data transmission and data reception.

10. The system debugging method according to claim 8, comprising the step of:
maximizing a distance between a clock transmission coil and any other coils that are specialized for clock transmission, data transmission, and data reception.

11. The system debugging method according to claim 1, wherein the first control circuit settles the communication condition using a result of adjusting an offset for a differential output from a reception amplifier in the first transceiver circuit, and
wherein the second control circuit settles the communication condition using a result of adjusting an offset for a differential output from a reception amplifier in the second transceiver circuit.

12. The system debugging method according to claim 1,
wherein the first control circuit settles the communication condition using a result of adjusting a determination timing for an output from a reception amplifier in the first transceiver circuit, and
wherein the second control circuit settles the communication condition using a result of adjusting a determination timing for an output from a reception amplifier in the second transceiver circuit.

13. The system debugging method according to claim 1,
wherein, when the wireless communication is performed in synchronization with a clock, the first transceiver circuit transmits a clock signal, and
wherein the second control circuit settles the communication condition by measuring intensity of a determination signal amplitude from a comparator that is included in the second transceiver circuit and determines a logical value for a received clock signal.

14. The system debugging method according to claim 1,
wherein, when the wireless communication is performed asynchronously, the first control circuit settles the communication condition by measuring intensity of a determination signal amplitude from a comparator that is included in the first transceiver circuit and determines a logical value for a received clock signal, and
wherein the second control circuit settles the communication condition by measuring intensity of a determination signal amplitude from a comparator that is included in the second transceiver circuit and determines a logical value for a received clock signal.

15. The system debugging method according to claim 13, comprising the steps of:
measuring determination signal amplitude intensity by gradually increasing hysteresis characteristics of the comparator to determine whether or not an output pulse from the comparator can recover a clock; and
using a hysteresis characteristic value at a given boundary to determine amplitude intensity.

16. System debugging equipment that is coupled with a microcomputer having a debugging support circuit for supporting a system debugging and is used for a system debugging of a target system controlled by the microcomputer, the system debugging equipment comprising:
a second coil arrangement that is placed opposite to a first coil arrangement included in the microcomputer and is capable of magnetic field coupling;
a debugger coupled with the second coil arrangement; and
a magnetic field coupling interface IC having a transceiver circuit and a control circuit,
wherein the debugger performs wireless communication with the microcomputer based on magnetic field coupling in accordance with a pulse transmission technique,
wherein the transceiver circuit is coupled with the second coil arrangement at one side and with the debugger at another side, and
wherein the control circuit is coupled with the debugger and provides the transceiver circuit with a communication condition based on magnetic field coupling.

17. The system debugging equipment according to claim 16, comprising:
an interfacing flexible substrate that is mounted with a magnetic field coupling interface IC and forms an interface wiring for coupling the mounted magnetic field coupling interface IC with the debugger.

18. The system debugging equipment according to claim 17,
wherein the second coil arrangement includes at least one second coil formed over the interfacing flexible substrate.

19. The system debugging equipment according to claim 17,
wherein the second coil arrangement includes at least one second coil formed over a conductive layer of a semiconductor integrated circuit chip for forming the magnetic field coupling interface IC.

20. The system debugging equipment according to claim 17,
wherein a tip of the interfacing flexible substrate has a plan shape similar to a plan shape of a package for the microcomputer.

21. The system debugging equipment according to claim 16,
wherein the second coil arrangement includes second coils that independently function as a transmission coil and a reception coil.

22. The system debugging equipment according to claim 21,
wherein the second coil arrangement includes second coils independently formed for clock reception, data transmission, and data reception.

23. The system debugging equipment according to claim 22,
wherein a maximum distance is ensured between a clock reception coil and any other coils that are specialized for clock transmission, data transmission, and data reception.

24. The system debugging equipment according to claim 16,
wherein the control circuit settles the communication condition using a result of adjusting an offset for a differential output from a reception amplifier in the transceiver circuit.

25. The system debugging equipment according to claim 16,
wherein the control circuit settles the communication condition by configuring a result of adjusting a determination timing for output from a reception amplifier in the transceiver circuit.

26. The system debugging equipment according to claim 16,
wherein the control circuit settles the communication condition by measuring intensity of determination signal amplitude from a comparator that is included in the transceiver circuit and determines a logical value for a received signal.

27. The system debugging equipment according to claim 26,
wherein the determination signal amplitude intensity is measured by gradually increasing hysteresis characteristics of the comparator and determining whether or not an output pulse from the comparator can recover a clock, and
wherein a hysteresis characteristic value at a given boundary is used to determine amplitude intensity.

28. A microcomputer comprising:
a central processing unit for executing an instruction;
a debugging support circuit that is coupled with the central processing unit and supports a system debug; and
a wireless-communications interface circuit that is coupled with the central processing unit and performs wireless communication with outside, wherein the wireless-communications interface circuit includes: a transceiver circuit for performing wireless communication based on magnetic field coupling using a coil arrangement in accordance with a pulse transmission technique, and a control circuit for providing the transceiver circuit with a communication condition, wherein the control circuit settles the communication conditions during an initial operation of the microcomputer, and recognizes a response to a signal transmitted from the transceiver circuit to the outside to notify initialization completion to the outside using the transceiver circuit, wherein the central processing unit starts operating after a wait for an instruction from the transceiver circuit, wherein the transceiver circuit includes: a transmission driver for driving a transmission coil, a reception amplifier for amplifying a current flowing through a reception coil, and a comparator for determining a logical value for a reception signal from the reception amplifier, and wherein the control circuit settles the communication condition using a result of adjusting an offset for a differential output from the reception amplifier.

29. A microcomputer comprising:

a central processing unit for executing an instruction;

a debugging support circuit that is coupled with the central processing unit and supports a system debug; and a wireless-communication interface circuit that is coupled with the central processing unit and performs wireless communication with outside, wherein the wireless-communications interface circuit includes: a transceiver circuit for performing wireless communication based on magnetic field coupling using a coil arrangement in accordance with a pulse transmission technique, and a control circuit for providing the transceiver circuit with a communication condition, wherein the control circuit settles the communication condition during an initial operation of the microcomputer, and recognizes a response to a signal transmitted from the transceiver circuit to the outside to notify initialization completion to the outside using the transceiver circuit, wherein the central processing unit starts operating after a wait for an instruction from the transceiver circuit, wherein the transceiver circuit includes: a transmission driver for driving a transmission coil, a reception amplifier for amplifying a current flowing through a reception coil, and a comparator for determining a logical value for a reception signal from the reception amplifier, and wherein the control circuit settles the communication condition by configuring a result of adjusting a determination timing for output from the reception amplifier.

30. A microcomputer comprising:

a central processing unit for executing an instruction;

a debugging support circuit that is coupled with the central processing unit and supports a system debug; and a wireless-communications interface circuit that is coupled with the central processing unit and performs wireless communication with outside, wherein the wireless-communications interface circuit includes: a transceiver circuit for performing wireless communication based on magnetic field coupling using a coil arrangement in accordance with a pulse transmission technique, and a control circuit for providing the transceiver circuit with a communication condition, wherein the control circuit settles the communication condition during an initial operation of the microcomputer, and recognizes a response to a signal transmitted from the transceiver circuit to the outside to notify initialization completion to the outside using the transceiver circuit, wherein the central processing unit starts operating after a wait for an instruction from the transceiver circuit, wherein the transceiver circuit includes: a transmission driver for driving a transmission coil, a reception amplifier for amplifying a current flowing through a reception coil, and a comparator for determining a logical value for a reception signal from the reception amplifier, and wherein the control circuit settles the communication condition by measuring intensity of determination signal amplitude from the comparator.

31. The microcomputer according to claim 30, wherein the determination signal amplitude intensity is measured by gradually increasing hysteresis characteristics of the comparator to determine whether or not an output pulse from the comparator can recover a clock, and determining amplitude intensity using a hysteresis characteristic value at a given boundary.

32. A system debugging method for a debugger to control a microcomputer having a debugging support circuit for supporting a system debugging, comprising:

providing a microcomputer including a central processing unit which performs instructions, the debugging support circuit which is coupled with the central processing unit and supports the system debugging and a wireless-communication interface circuit which is coupled with the debugging support circuit and performs wireless communication;

wherein the wireless-communication interface circuit includes:

a data transmission driver for generating a complementary pulse in accordance with transmission data supplied from the debugging support circuit, a first coil arrangement having a data transmission coil for transmitting the complementary pulse and a data reception coil for receiving a reception pulse, a comparator which detects positive and negative voltage polarities of the reception pulse and outputs a detection value to the debugging support circuit, and a delay circuit which generates detection timing for the comparator based on a clock supplied from the debugging support circuit, wherein the comparator detects the voltage polarities of the reception pulse at the detection timing generated from the delay circuit, and wherein the debugger is adapted to be coupled to a magnetic field coupling interface which has a second coil arrangement for wireless-communication interface;

performing wireless communication between the microcomputer and the debugger in accordance with a pulse transmission technique based on magnetic field coupling by oppositely placing the first coil arrangement and the second coil arrangement;

operating the microcomputer to perform a process for adjusting the detection timing generated from the delay circuit for configuring a communication condition of the wireless communication during an initialization operation of the system debugging;

operating the microcomputer to await control from the debugger via the debugging support circuit when the microcomputer establishes communication with the debugger; and operating the debugger to await establishment of the communication and to proceed with control of the microcomputer in accordance with the wireless communication, the wireless communication being performed by detecting the voltage polarities of the reception pulse by the comparator at the detection timing generated from the delay circuit in accordance with the control from the debugger.

33. System debugging equipment that is coupled with a microcomputer having a debugging support circuit for supporting a system debugging and is used for a system debugging of a target system controlled by the microcomputer, the system debugging equipment comprising:
    a second coil arrangement for wireless-communication interface which is capable of magnetic field coupling by oppositely placing a first coil arrangement included in the microcomputer;
    a magnetic field coupling interface which is coupled with the second coil arrangement; and
    a debugger which is capable of being coupled to the magnetic field coupling interface,
    wherein the second coil arrangement has a data transmission coil for transmitting a complementary pulse and a data reception coil for receiving a reception pulse,
    wherein the magnetic field coupling interface includes:
        a data transmission driver for generating the complementary pulse in accordance with transmission data supplied from the debugger and for driving the data transmission coil,
        a comparator which detects positive and negative voltage polarities of the reception pulse, and
        a delay circuit which generates detection timing for the comparator based on a clock, and
        a control circuit which controls communication conditions of data transmission and data reception,
    wherein determining timing is obtained by detecting inverting timing of the comparator during a change of delay amount of the delay circuit in a receiving state in which a known data pattern is received from a first coil of the first coil arrangement included in the microcomputer, and the determining timing is set in the control circuit,
    wherein the comparator configures a communication condition by detecting voltage polarities of a reception pulse at the detection timing generated from the delay circuit during an initialization operation of the microcomputer and the system debugging equipment, and
    wherein the debugger performs a wireless communication with the microcomputer in accordance with a pulse transmission technique based on the magnetic field coupling.

34. A microcomputer including a central processing unit which performs instructions, a debugging support circuit which is coupled with the central processing unit and supports a system debugging, and a wireless-communication interface circuit which is coupled with the debugging support circuit and performs wireless communication based on magnetic field coupling,
    wherein the wireless-communication interface circuit includes:
        a data transmission driver for generating a complementary pulse in accordance with transmission data supplied from the debugging support circuit,
        a first coil arrangement having a data transmission coil for transmitting the complementary pulse and a data reception coil for receiving a reception pulse,
        a comparator which detects positive and negative voltage polarities of the reception pulse and outputs a detection value to the debugging support circuit,
        a delay circuit which generates detection timing for the comparator based on a clock supplied from the debugging support circuit, and
        a control circuit which controls a communication condition of data transmission and data reception,
    wherein the comparator detects the voltage polarities of the reception pulse at the detection timing generated from the delay circuit,
    wherein the control circuit performs a process for adjusting the detection timing generated from the delay circuit for configuring the communication condition during an initialization operation of the microcomputer,
    wherein the control circuit recognizes a response to the complementary pulse transmitted to an outside of the microcomputer, and then the control circuit informs of a completion of the initialization operation to the outside of the microcomputer by using the wireless-communication interface circuit, and
    wherein the central processing unit awaits an instruction from the wireless-communication interface circuit and then an operation of the central processing unit is initiated in response to the instruction from the wireless-communication interface circuit.

* * * * *